(12) United States Patent
Kim

(10) Patent No.: US 11,978,695 B2
(45) Date of Patent: May 7, 2024

(54) SEMICONDUCTOR PACKAGE AND METHOD OF FABRICATING THE SAME

(71) Applicant: Samsung Electronics Co., Ltd., Suwon-si (KR)

(72) Inventor: Sang-Uk Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 303 days.

(21) Appl. No.: 17/513,282

(22) Filed: Oct. 28, 2021

(65) Prior Publication Data
US 2022/0336336 A1    Oct. 20, 2022

(30) Foreign Application Priority Data

Apr. 19, 2021  (KR) .......................... 10-2021-0050353

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4807* (2013.01); *H01L 21/565* (2013.01);
(Continued)

(58) Field of Classification Search
CPC ........... H01L 23/49822; H01L 21/4807; H01L 21/565; H01L 23/3157; H01L 23/49866; H01L 23/642; H01L 24/08; H01L 24/48; H01L 28/40; H01L 2224/08235; H01L 2224/48227; H01L 21/6835; H01L 21/568; H01L 23/50; H01L 23/49816; H01L 23/5389; H01L 2221/68345; H01L 2221/68372; H01L 24/20; H01L 25/105; H01L 24/19; H01L 2224/18; H01L 2224/48091; H01L 2924/00014; H01L 2924/181; H01L 2924/19105; H01L 23/64; H01L 22/32; H01L 23/3107; H01L 23/5386; H01L 23/481; H01L 23/485; H01L 23/49827; H01L 23/525; G01R 31/26
(Continued)

(56) References Cited

U.S. PATENT DOCUMENTS 7,738,256 B2 *  6/2010  Sawatari ............. H01L 23/5389
                                                      361/761
8,482,117 B2    7/2013  Kobayashi et al.
(Continued)

*Primary Examiner* — Vu A Vu
(74) *Attorney, Agent, or Firm* — Muir Patent Law, PLLC

(57) ABSTRACT

A semiconductor package includes a first redistribution substrate, a connection substrate on the first redistribution substrate and having a first opening and a second opening that penetrate the connection substrate, a semiconductor chip on the first redistribution substrate and in the first opening of the connection substrate, a chip module on the first redistribution substrate and in the second opening of the connection substrate, and a molding layer that covers the semiconductor chip, the chip module, and the connection substrate. The chip module includes an inner substrate and a first passive device on the inner substrate. In the second opening, the molding layer covers the first passive device on the inner substrate.

20 Claims, 17 Drawing Sheets

(51) Int. Cl.
*H01L 21/56* (2006.01)
*H01L 23/31* (2006.01)
*H01L 23/64* (2006.01)
*H01L 23/00* (2006.01)
*H01L 49/02* (2006.01)

(52) U.S. Cl.
CPC .... *H01L 23/3157* (2013.01); *H01L 23/49866* (2013.01); *H01L 23/642* (2013.01); *H01L 24/08* (2013.01); *H01L 24/48* (2013.01); *H01L 28/40* (2013.01); *H01L 2224/08235* (2013.01); *H01L 2224/48227* (2013.01)

(58) Field of Classification Search
USPC .......................................................... 257/678
See application file for complete search history.

(56) References Cited

U.S. PATENT DOCUMENTS

| | | | |
|---|---|---|---|
| 8,597,979 | B1 | 12/2013 | Burgyan |
| 8,872,041 | B2 * | 10/2014 | Lee ........................ H05K 3/462 |
| | | | 174/250 |
| 9,230,944 | B1 * | 1/2016 | Lambert ............. H01L 21/4846 |
| 9,578,749 | B2 | 2/2017 | Cho et al. |
| 9,961,785 | B2 * | 5/2018 | Sato .................... H05K 3/4697 |
| 10,026,678 | B1 * | 7/2018 | Cho ...................... H01L 24/20 |
| 10,153,219 | B2 * | 12/2018 | Jeon .................... H01L 23/5389 |
| 10,256,192 | B2 | 4/2019 | Yi et al. |
| 10,388,612 | B2 * | 8/2019 | Lin ....................... H01L 24/97 |
| 10,763,217 | B2 | 9/2020 | Lee et al. |
| 10,784,220 | B2 * | 9/2020 | Jeng ..................... H01L 24/82 |
| 10,790,239 | B2 | 9/2020 | Lim et al. |
| 10,804,205 | B1 * | 10/2020 | Lin .................... H01L 23/5383 |
| 10,833,040 | B2 | 11/2020 | Baek et al. |
| 10,833,041 | B2 * | 11/2020 | Hwang .................. H01L 24/25 |
| 10,903,169 | B2 * | 1/2021 | Huang ................ H01L 21/4857 |
| 11,342,272 | B2 * | 5/2022 | Hsu ....................... H01L 23/64 |
| 2020/0381344 | A1 * | 12/2020 | Patil ....................... H01L 24/24 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0050353 filed on Apr. 19, 2021 in the Korean Intellectual Property Office, the disclosure of which is hereby incorporated by reference in its entirety.

BACKGROUND

The present inventive concepts relate to a semiconductor package and a method of fabricating the same, and more particularly, to a semiconductor package including a passive device and a method of fabricating the same.

A semiconductor package is provided to implement an integrated circuit chip to be suitable for use in electronic products. With the recent development of electronic industry, the semiconductor package is variously developed to reach the goal of compact size, small weight, and/or low manufacturing costs. A size of semiconductor chip becomes smaller with high integration of the semiconductor chip. For semiconductor chips with small sizes, solder balls may be difficult to adhere, handle, and test. Additionally, when semiconductor chips have various sizes, various mount boards to accommodate such semiconductor chips may be necessary. A fan-out panel level package is proposed to solve these problems as described above. In the case of fan-out panel semiconductor packages, the area of redistribution lines is greater than that of the semiconductor chip, and thus areas of such fan-out panel semiconductor packages tend to increase compared to the utilization of the semiconductor chip.

SUMMARY

Some example embodiments of the present inventive concepts provide a semiconductor package with improved structural stability and a method of fabricating the same.

Some example embodiments of the present inventive concepts provide a semiconductor package with an increased degree of freedom of wiring and a method of fabricating the same.

Some example embodiments of the present inventive concepts provide a method of fabricating a semiconductor package, which method reduces the occurrence of defects.

The object of the present inventive concepts is not limited to the mentioned above, and other objects which have not been mentioned above will be clearly understood to those skilled in the art from the following description.

According to some example embodiments of the present inventive concepts, a semiconductor package may include a first redistribution substrate, a connection substrate on the first redistribution substrate, the connection substrate including a first opening and a second opening that penetrate the connection substrate, a semiconductor chip on the first redistribution substrate and disposed in the first opening of the connection substrate, a chip module on the first redistribution substrate and disposed in the second opening of the connection substrate, and a molding layer that covers the semiconductor chip, the chip module, and the connection substrate. The chip module may include an inner substrate, and a first passive device on the inner substrate. In the second opening, the molding layer may cover the first passive device on the inner substrate.

According to some example embodiments of the present inventive concepts, a semiconductor package may include a first redistribution substrate, a semiconductor chip mounted on the first redistribution substrate, a chip module on the first redistribution substrate, the chip module being horizontally spaced apart from the semiconductor chip, a molding layer on the first redistribution substrate, the molding layer surrounding the semiconductor chip and the chip module, a second redistribution substrate on the molding layer, a connection terminal disposed in the molding layer and connecting the first redistribution substrate to the second redistribution substrate, and an external terminal on a bottom surface of the first redistribution substrate. The chip module may include an inner substrate, and a first device mounted on the inner substrate.

According to some example embodiments of the present inventive concepts, a method of fabricating a semiconductor package may include forming a chip module, forming in a connection substrate a first opening and a second opening that penetrate the connection substrate, providing a carrier substrate below the connection substrate, providing a semiconductor chip into the first opening and the chip module into the second opening, forming a molding layer by coating a molding member on the semiconductor chip, the chip module, and the connection substrate, removing the carrier substrate to expose a bottom surface of the semiconductor chip, a bottom surface of the chip module, and a bottom surface of the connection substrate, and forming a redistribution substrate below the semiconductor chip, the chip module, and the connection substrate. The step of forming the chip module may include providing an inner substrate, mounting a passive device on a first land at a top surface of the inner substrate using an inner connection terminal, and inspecting an operation of the passive device by using a second land at a bottom surface of the inner substrate.

DETAILED DESCRIPTION OF EMBODIMENTS

Figure 1:
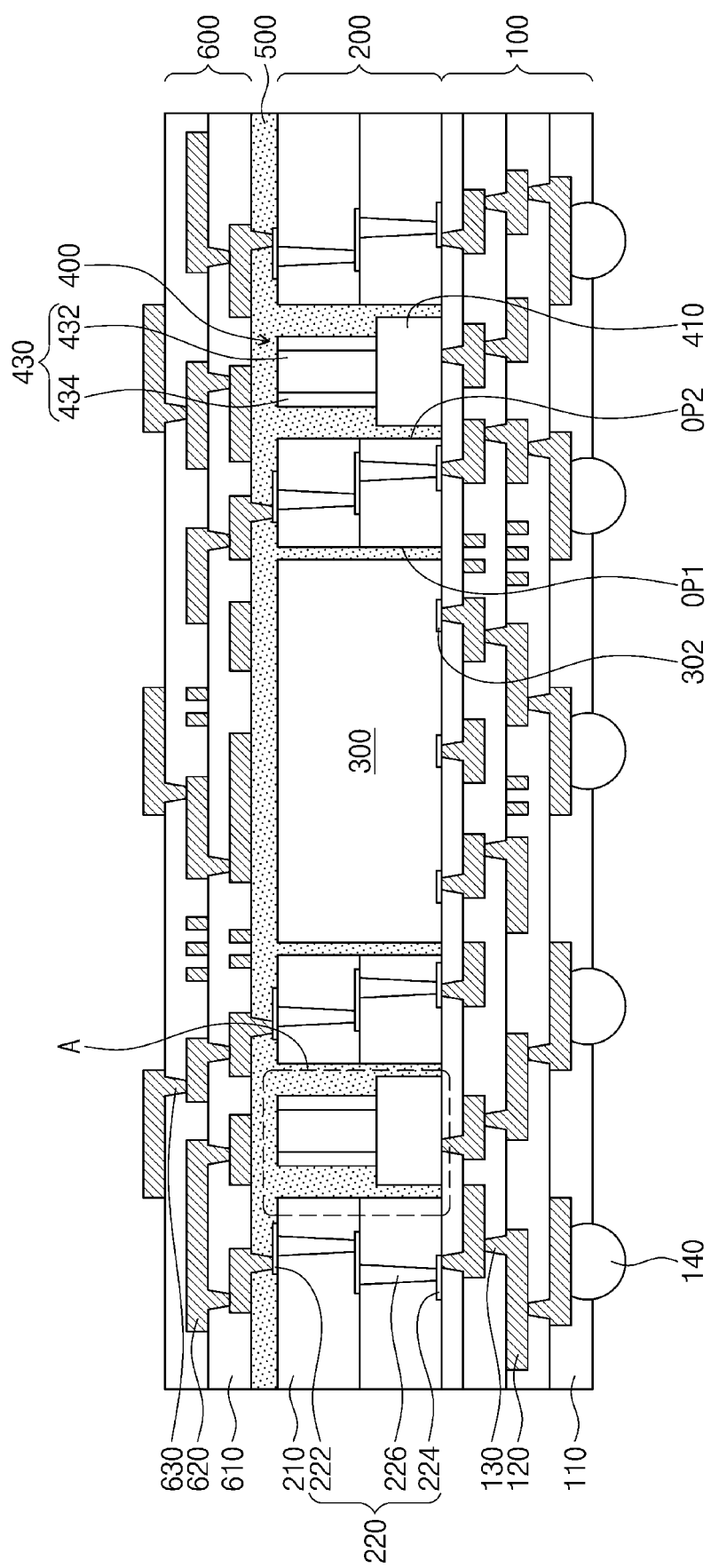
FIG. 1 illustrates a cross-sectional view showing a semiconductor package according to some example embodiments of the present inventive concepts.

FIG. 1 illustrates a cross-sectional view showing a semiconductor package according to some example embodiments of the present inventive concepts. FIGS. 2 to 6 illustrate enlarged cross-sectional views of section A depicted in FIG. 1, showing a chip module of a semiconductor package according to some example embodiments of the present inventive concepts.

Referring to FIG. 1, a first redistribution substrate 100 may be provided. The first redistribution substrate 100 may include one or more substrate wiring layers that are stacked on each other. The substrate wiring layers may each include a first substrate dielectric layer 110 and a first substrate wiring pattern 120 in the first substrate dielectric layer 110. The first substrate wiring pattern 120 of one substrate wiring layer may be electrically connected to the first substrate wiring pattern 120 of another substrate wiring layer.

The first substrate dielectric layer 110 may include or may be formed of a dielectric polymer or a photo-imagable dielectric (PID) polymer. For example, the photo-imagable dielectric polymer may include one or more of photosensitive polyimide, polybenzoxazole (PBO), phenolic polymers, and benzocyclobutene polymers. The first substrate dielectric layer 110 of a lowermost substrate wiring layer may serve as a protective layer that protects the first substrate wiring pattern 120 in the first redistribution substrate 100.

The first substrate wiring pattern 120 may be provided in the first substrate dielectric layer 110. The first substrate wiring pattern 120 may horizontally extend in the first substrate dielectric layer 110. For example, the first substrate wiring pattern 120 may be a pad or a signal line of the substrate wiring layer. The first substrate wiring pattern 120 may be a component for horizontal redistribution in the first redistribution substrate 100. The first substrate wiring pattern 120 may be provided in an upper portion of the first substrate dielectric layer 110. The first substrate wiring pattern 120 may have a top surface exposed at a top surface of the first substrate dielectric layer 110. The first substrate wiring pattern 120 may include or may be formed of a conductive material. For example, the first substrate wiring pattern 120 may include or may be formed of copper (Cu). The first substrate wiring pattern 120 of the lowermost substrate wiring layer may serve as a pad to which an external terminal 140 is coupled.

A first substrate via 130 may be provided on the first substrate wiring pattern 120. The first substrate via 130 may be a component for vertical connection between the first substrate wiring patterns 120 of neighboring substrate wiring layers. The first substrate via 130 may be a component for connection between the first substrate wiring pattern 120 of an uppermost substrate wiring layer and either a chip pad 302 of a semiconductor chip 300 which will be discussed below or a first land 422 of a chip module 400 which will be discussed below. For example, the first substrate via 130 may be provided on the top surface at a portion of the first substrate wiring pattern 120. The first substrate via 130 may penetrate from the top surface of the first substrate wiring pattern 120 to the first substrate dielectric layer 110 of an overlying substrate wiring layer, and may be coupled to a bottom surface of the first substrate wiring pattern 120 in the overlying substrate wiring layer. The first substrate via 130 may penetrate from the top surface of the first substrate wiring pattern 120 to an uppermost first substrate dielectric layer 110, and may be coupled to a bottom surface of either the chip pad 302 or the first land 422.

A plurality of external terminals 140 may be provided below the first redistribution substrate 100. The external terminals 140 may penetrate a lowermost first substrate dielectric layer 110 to be coupled to the first substrate wiring pattern 120. The external terminals 140 may include or may be formed of a solder ball or a solder bump.

In the embodiment of FIG. 1, a semiconductor package may be provided in the form of a fan-out panel level package (FO-PLP). For example, a connection substrate 200 may be provided on the first redistribution substrate 100. The connection substrate 200 may have a first opening OP1 and at least one second opening OP2 that penetrate therethrough. For example, the first opening OP1 and the at least one second opening OP2 may each be shaped like an open hole that connects top and bottom surfaces of the connection substrate 200. The first opening OP1 and the at least one second opening OP2 may be spaced apart from each other. The first opening OP1 may be defined as a space to accommodate a semiconductor chip 300 to be provided therein as discussed below, and the at least one second opening OP2 may be defined as a space to accommodate a chip module 400 to be provided therein as discussed below. The bottom surface of the connection substrate 200 may be in contact with a top surface of the first redistribution substrate 100. The present inventive concepts, however, are not limited thereto, and when a semiconductor package is fabricated in a chip-last scheme, the bottom surface of the connection substrate 200 may be spaced apart from the top surface of the first redistribution substrate 100. For example, the connection substrate 200 may be connected to the first redistribution substrate 100 through a separate terminal such as a micro-solder ball. The following description will focus on the embodiment of FIG. 1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The connection substrate 200 may include a base layer 210 and a conductive member 220 that is a line pattern provided in the base layer 210. The conductive member 220 may have a wiring structure that vertically connects the first redistribution substrate 100 to a second redistribution substrate 600 which will be discussed below. The conductive member 220 may be located between the first opening OP1 and an outer lateral surface of the connection substrate 200, between the at least one second opening OP2 and another outer lateral surface of the connection substrate 200, or between the first opening OP1 and the at least one second opening OP2. The conductive member 220 may include upper pads 222, lower pads 224, and vias 226. The upper pads 222 may be located on the top surface of the connection substrate 200. The lower pads 224 may be located on the bottom surface of the connection substrate 200. The vias 226 may penetrate the base layer 210 and electrically connect the upper pads 222 to the lower pads 224. The base layer 210 may include or may be formed of silicon oxide (SiO). The upper pads 222, the lower pads 224, and the vias 226 may include or may be formed of a conductor or metal, such as copper (Cu).

The connection substrate 200 may be mounted on the first redistribution substrate 100. For example, the connection substrate 200 may contact the first redistribution substrate 100, and may be connected to the first redistribution substrate 100 through the first substrate via 130 which penetrates the uppermost first substrate dielectric layer 110 and is coupled to the lower pad 224 of the connection substrate 200. Therefore, the connection substrate 200 may be electrically connected to the semiconductor chip 300 and the external terminals 140.

The semiconductor chip 300 may be located on the first redistribution substrate 100. The semiconductor chip 300 may be disposed in the first opening OP1 of the connection substrate 200. In this case, the semiconductor chip 300 may be placed on the first redistribution substrate 100 exposed by the first opening OP1. The semiconductor chip 300 may be in contact with the top surface of the first redistribution substrate 100. The semiconductor chip 300 may be spaced apart from the connection substrate 200. For example, the semiconductor chip 300 may be spaced apart from an inner wall of the first opening OP1. The semiconductor chip 300 may be located at a level from the first redistribution substrate 100 which is the same as or lower than a level of the top surface of the connection substrate 200. The semiconductor chip 300 may be, for example, a memory chip or a logic chip.

The semiconductor chip 300 may be connected to the first redistribution substrate 100. A direct bonding method may be used to mount the semiconductor chip 300 on the first redistribution substrate 100. The semiconductor chip 300 may include a plurality of chip pads 302 electrically connected to integrated circuits of the semiconductor chip 300. The chip pads 302 may be provided on a bottom surface of the semiconductor chip 300. For example, the bottom surface of the semiconductor chip 300 may be an active surface at which an integrated circuits are formed. The semiconductor chip 300 may contact the first redistribution substrate 100, and may be connected to the first redistribution substrate 100 through the first substrate via 130 which penetrates the uppermost first substrate dielectric layer 110 and is coupled to the chip pad 302 of the semiconductor chip 300. Therefore, the semiconductor chip 300 may be electrically connected to the connection substrate 200 and the external terminals 140.

At least one chip module 400 may be located on the first redistribution substrate 100. The at least one chip module 400 may be disposed in the at least one second opening OP2 of the connection substrate 200. In this case, the at least one chip module 400 may be placed on the first redistribution substrate 100 exposed by the second opening OP2. The at least one chip module 400 may be in contact with the top surface of the first redistribution substrate 100. The at least one chip module 400 may be spaced apart from the connection substrate 200. For example, the at least one chip module 400 may be spaced apart from an inner wall of the second opening OP2 in which the at least one second chip module 400 is disposed. The at least one chip module 400 may have a top surface located at a level from the first redistribution substrate 100 which is the same as or lower than a level of the top surface of the connection substrate 200. For example, the at least one chip module 400 may have a height h1 which is the same as or less than a height h2 of the connection substrate 200 (see, FIG. 2). With reference to FIGS. 2 to 5, the following will describe in detail a configuration of a single chip module 400.

Figure 2:
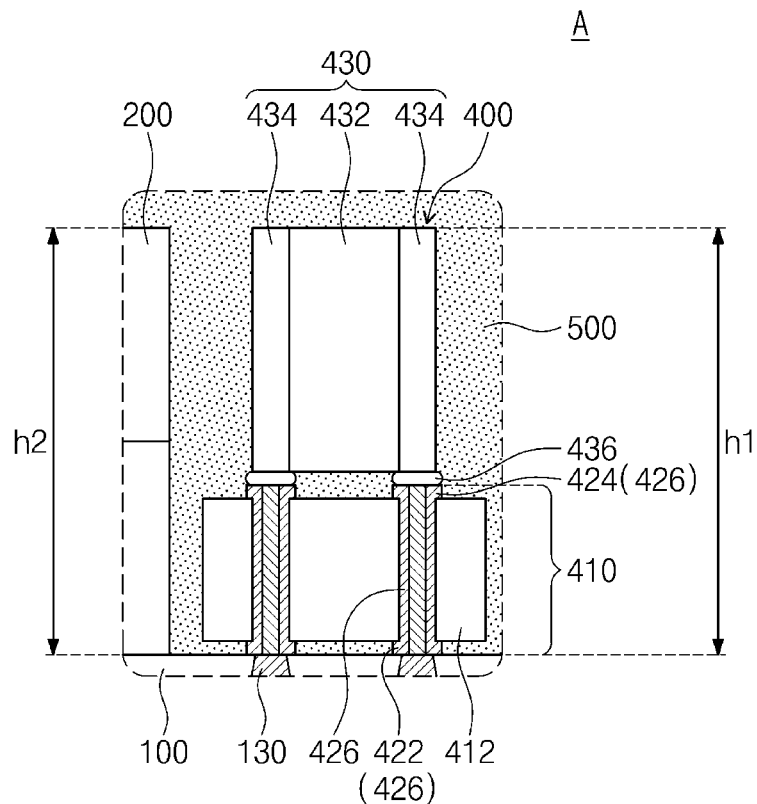
FIGS. 2 to 6 illustrate enlarged cross-sectional views showing a chip module of a semiconductor package according to some example embodiments of the present inventive concepts.

Referring to FIGS. 1 and 2, the chip module 400 may include an inner substrate 410 and a first passive device 430 mounted on the inner substrate 410.

The inner substrate 410 may include a core part 412 and vertical connection terminals 426.

The core part 412 may extend in one direction. When viewed in a plan view, the core part 412 may include a single core pattern. The core part 412 may include or may be formed of a dielectric material. For example, the core part 412 may include or may be formed of one of glass fiber, ceramic plate, epoxy, and resin.

The core part 412 may have the vertical connection terminals 426 that vertically penetrate the core part 412. The vertical connection terminals 426 may extend from top to bottom surfaces of the core part 412. Portions of the vertical connection terminals 426 may extend onto the bottom surface of the core part 412. The portions of the vertical connection terminals 426 that protrude onto the bottom surface of the core part 412 may correspond to first lands 422 that serve as pads of the chip module 400. Other portions of the vertical connection terminals 426 may extend onto the top surface of the core part 412. The portions of the vertical connection terminals 426 that protrude onto the top surface of the core part 412 may correspond to second lands 424 on which the first passive device 430 is mounted. In FIG. 2, the vertical connection terminal 426 and the first and second lands 422 and 424 are illustrated as a single piece, but the present inventive concepts are not limited thereto.

Figure 3:
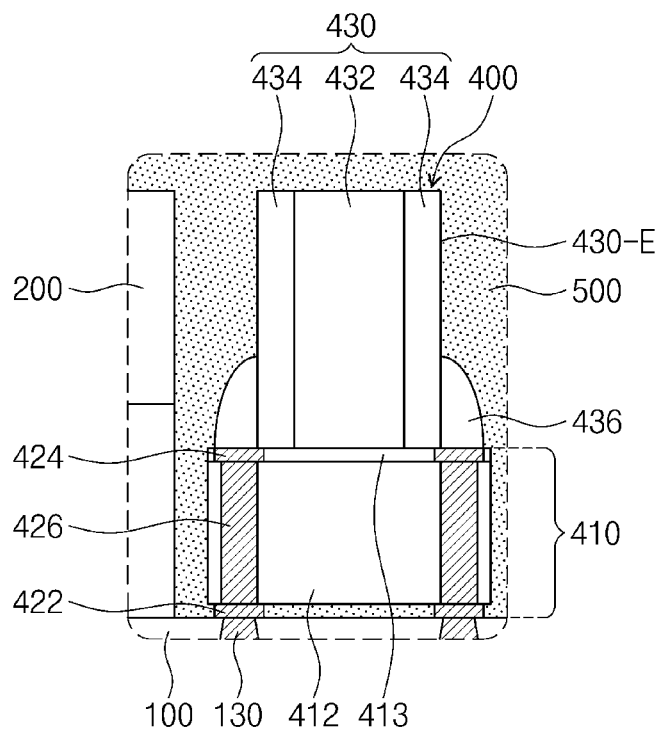

As shown in FIG. 3, the first lands 422 and the second lands 424 may be provided as components separated from the vertical connection terminals 426. For example, the first lands 422 may be provided on the bottom surface of the core part 412, and the second lands 424 may be provided on the top surface of the core part 412. The vertical connection terminals 426 may vertically penetrate the core part 412 and connect the first lands 422 to the second lands 424. A protective pattern 413 may be provided on at least one selected from the top and bottom surfaces of the core part 412. The protective pattern 413 may surround the first lands 422 or the second lands 424, and the first lands 422 or the second lands 424 may be exposed at one surface of the protective pattern 413. The one surface of the protective pattern 413 may be coplanar with top surfaces of the first lands 422 or bottom surfaces of the second lands 424.

In the embodiment of FIG. 2 or 3, the first lands 422 may be vertically aligned with the second lands 424. For example, the inner substrate 410 may not separately redistribute the first passive device 430, and thus the inner substrate 410 may have a reduced thickness. For example, the first lands 422 may be vertically aligned with or may be vertically overlapped with the second lands 424, respectively, and such alignment allows each vertical connection terminal 426 to connect a corresponding first land 422 to a corresponding second land 422 without using additional redistribution wirings in the inner substrate 410. Therefore, the chip module 400 may become small in size and have a small space that occupies in a semiconductor package. As a result, it may be possible to provide a compact-sized semiconductor package.

Although the core part 412 having a single core pattern is discussed in some example embodiments, but the present inventive concepts are not limited thereto.

Figure 4:
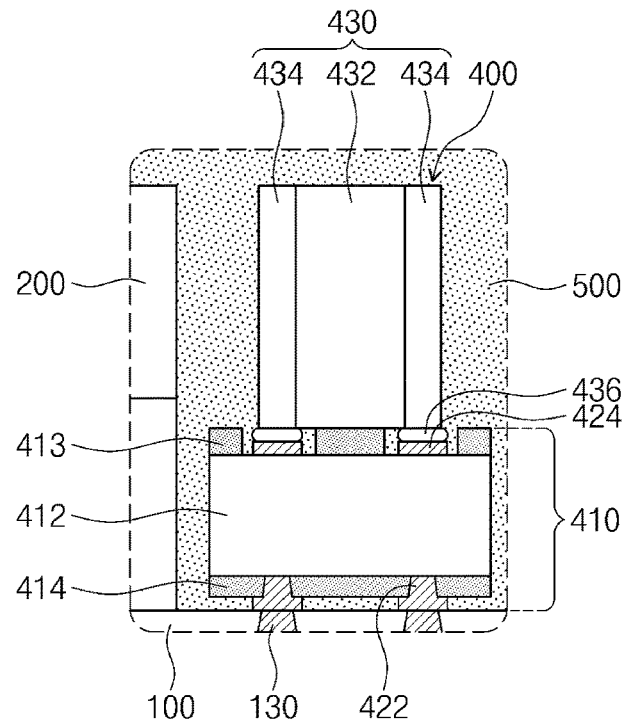

According to some example embodiments, as shown in FIG. 4, the core part 412 may include two or more core patterns. For example, the inner substrate 410 may include a plurality of core patterns that are spaced apart from each other when viewed in a plan view. In this case, the core patterns of the core part 412 may include or may be formed of a conductive material. In some embodiments, the core part 412 may include or may be formed of one selected from stainless steels, aluminum (Al), nickel (Ni), magnesium (Mg), zinc (Zn), tantalum (Ta), and any combination thereof.

Similarly to the protective pattern 413 which is provided as illustrated in FIG. 3, an upper protective pattern 413 may be provided on the top surface of the core part 412. The upper protective pattern 413 may surround the second lands 424, and the second lands 424 may be exposed on one surface of the upper protective pattern 413.

A lower protective pattern 414 may be provided on the bottom surface of the core part 412. The first lands 422 may be provided on a bottom surface of the lower protective pattern 414, and may penetrate the lower protective pattern 414 to be connected to the core patterns of the core part 412.

The first lands 422 and the second lands 424 may be electrically connected to each other through the core patterns of the core part 412. Therefore, the inner substrate 410 may need no vertical connection terminals (see 426 of FIG. 3) separately provided for connecting the first lands 422 to the second lands 424.

Figure 5:
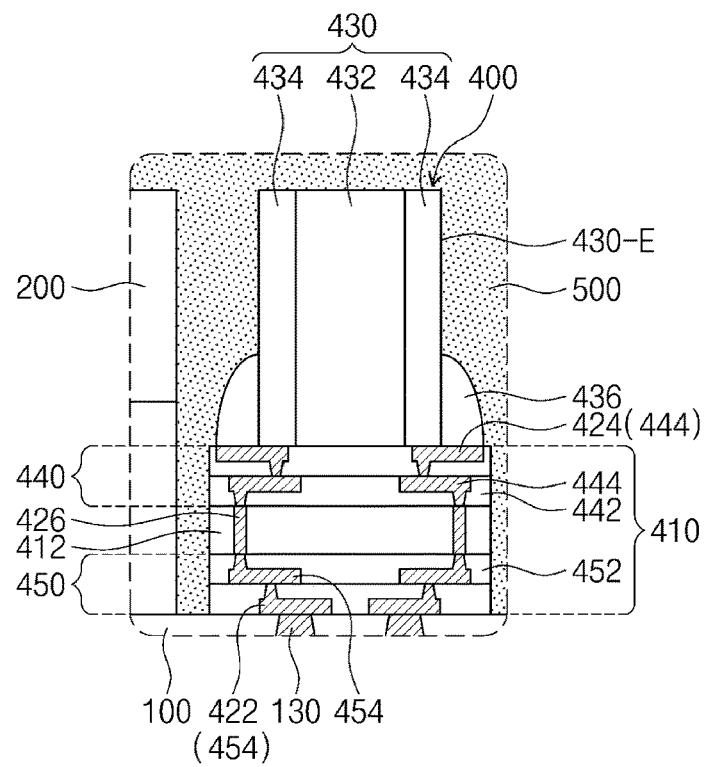

According to some example embodiments, as shown in FIG. 5, the inner substrate 410 may include an upper build-up part 440 and a lower build-up part 450.

The upper build-up part 440 may cover the top surface of the core part 412. The upper build-up part 440 may include a plurality of upper dielectric layers 442 and a plurality of upper wiring lines 444 that are sequentially stacked on the top surface of the core part 412. An uppermost one of the upper dielectric layers 442 may expose one or more of the upper wiring lines 444, and the exposed upper wiring lines 444 may correspond to the second lands 424 used for mounting the first passive device 430 on the inner substrate 410.

The lower build-up part 450 may cover the bottom surface of the core part 412. The lower build-up part 450 may include a plurality of lower dielectric layers 452 and a plurality of lower wiring lines 454 that are alternately stacked on the bottom surface of the core part 412. A lowermost one of the lower dielectric layers 452 may expose one or more of the lower wiring lines 454, and the exposed lower wiring lines 454 may correspond to the first lands 422 used for mounting the inner substrate 410 on the first redistribution substrate 100.

The upper and lower dielectric layers 442 and 452 may include or may be formed of prepreg, ajinomoto build-up film (ABF), FR-4, or bismaleimide triazine (BT). The upper and lower wiring lines 444 and 454 may include a circuit pattern. The lower wiring lines 454 may be electrically connected through the vertical connection terminals 426 to the upper wiring lines 444. The upper and lower wiring lines 444 and 454 may include or may be formed of one of copper (Cu), aluminum (Al), silver (Ag), tin (Sn), gold (Au), nickel (Ni), lead (Pb), titanium (Ti), and any combination thereof.

The upper build-up part 440 may be electrically connected to the lower build-up part 450. For example, the upper wiring lines 444 and the lower wiring lines 454 may be connected to each other through the vertical connection terminals 426 that vertically penetrate the core part 412.

In the embodiment of FIG. 4 or 5, the inner substrate 410 may redistribute the first passive device 430 which will be discussed below. Therefore, there may be an increase in degree of freedom in configuring the chip module 400 in which the first passive device 430 is mounted on the inner substrate 410 compared to a case where the first passive device 430 is directly mounted on the first redistribution substrate 100. As such, a semiconductor package may have an increased degree of freedom of wiring. Moreover, the chip module 400 may become small in size and have a small space that occupies in the semiconductor package. As a result, it may be possible to provide a compact-sized semiconductor package. The following description will focus on the embodiment of FIG. 2.

Referring back to FIGS. 1 and 2, the first passive device 430 may be provided in the inner substrate 410. The first passive device 430 may include at least one of passive device such as a capacitor, a resistor, or an inductor. In some example embodiments, the first passive device 430 may be replaced with an electronic device having an integrated circuit. For example, a memory chip may be provided to replace the first passive device 430.

For convenience, the following will describe an example in which a capacitor is adopted as the first passive device 430, but a resistor, an inductor, or any suitable device may be selected as the first passive device 430. According to the present inventive concepts, a configuration of the chip module 400 may be applicable to various passive devices other than capacitors.

As an embodiment that is not intended to limit the present inventive concepts, the first passive device 430 may be a multi-layer ceramic capacitor (MLCC) in which a pair of electrodes 434 are provided on opposite lateral surfaces of a ceramic main body 432. For example, the MLCC may include the electrodes 434 and the ceramic main body 432. The first passive device 430 may be electrically connected to the inner substrate 410 through inner connection terminals 436 provided between the second lands 424 that are surface mount lands and the opposite electrodes 434 of the first passive device 430. The inner connection terminals 436 may be lead-free solders including or being formed of tin or tin-silver.

In the embodiment of FIG. 2 or 4, the first passive device 430 may be provided on the second lands 424. For example, the opposite electrodes 434 of the first passive device 430 may be positioned on the second lands 424, and may be vertically aligned with the second lands 424 and the inner connection terminals 436. In other words, the first passive device 430 may be flip-chip mounted on the inner substrate 410.

When the inner substrate 410 includes the upper protective pattern 413 as the embodiment of FIG. 4, the upper protective pattern 413 may include or may be formed of a solder resist material. The upper protective pattern 413 may be spaced apart from the second lands 424. For example, the second lands 424 may be positioned in openings formed in the upper protective pattern 413, and in the openings, the inner connection terminals 436 may be coupled to the second lands 424.

In the embodiment of FIG. 3 or 5, the first passive device 430 may be provided not on the second lands 424 but between the second lands 424. The opposite electrodes 434 may not be vertically aligned with the vertical connection terminals 426. For example, the first passive device 430 may be mounted on the inner substrate 410 between the second lands 424, and may be in contact with the top surface of the core part 412, a top surface of the upper protective pattern 413, or a top surface of the upper build-up part 440. For example, a surface mount technology (SMT) may be employed to mount the first passive device 430 on the inner substrate 410. In this case, the first passive device 430 and the inner substrate 410 may be provided therebetween a dielectric adhesive layer (not shown) for rigid attachment of the first passive device 430. The inner connection terminals 436 may be provided between the second lands 424 and opposite edges 430-E (i.e., opposite sidewalls) of the first passive device 430. In some embodiments, the opposite edges 430-E may contact the second lands 424 and vertically extends from the second lands 424. Each of the inner connection terminals 436 may contact an upper surface of a corresponding one of the second lands 424 and a corresponding one of the opposite edges 430-E.

As the first passive device 430 is provided between the second lands 424, an electrical connection structure between the first passive device 430 and the second lands 424 may have a height that corresponds to a thickness of the first passive device 430. For example, the inner connection terminal 436 has a thickness substantially the same as or less than that of the first passive device 430, and the inner connection terminal 436 is provided between the first passive device 430 and the second lands 424. A thickness of the inner connection terminal 436 may not increase the height of the electrical connection structure. For example, the inner connection terminals 436 may not be disposed between bottom surfaces of the opposite electrodes 434 and upper surfaces of the second lands 424, and instead, may be disposed on the opposite edges 430-E of the first passive device 430, thereby causing no height increase of the chip module 400. The inner connection terminals 436 may be disposed in a space defined by the opposite edges 430-E and the upper surface of the second lands 424. The inner connection terminals 436 accommodated in such a space may contact the opposite edges 430-E and the upper surface of the second lands 424. The thickness of the inner connection terminal 436 may not increase the thickness of the chip module 400. In addition, the first passive device 430 may be located on the second lands 424 buried in another element such as the protective pattern 413 of FIG. 3 or the upper dielectric layer 442 of FIG. 5, and thicknesses of the second lands 424 may not increase the height of the electrical connection structure. Thus, the chip module 400 may have a thickness irrelevant to that of the inner connection terminal 436 and those of the second lands 424. The thickness of the inner connection terminal 436 and the thickness of the second lands 424 may not increase the thickness of the chip module 400.

As shown in FIG. 3 or 5, the inner connection terminal 436 may have a shape that covers lateral surfaces of the opposite electrodes of the first passive device 430. Therefore, an increased contact area may be provided between the inner connection terminal 436 and the opposite electrodes 434 of the first passive device 430, and a good electrical connection may be achieved between the first passive device 430 and the inner substrate 410. Accordingly, it may be possible to provide a semiconductor package with improved electrical characteristics.

According to some example embodiments of the present inventive concepts, in comparison with when the first passive device 430 is provided on the second lands 424, when the first passive device 430 is provided on the core part 412, the electrical connection structure may become small in height, and the chip module 400 may have a height that is reduced at least as much as a value that corresponds to the thickness of the second land 424 and the thickness of the inner connection terminal 436. As a result, it may be possible to provide a semiconductor package with reduced height and decreased size.

Referring again to FIGS. 1 and 2, the chip module 400 may be connected to the first redistribution substrate 100. A direct bonding method may be used to mount the chip module 400 on the first redistribution substrate 100. For example, the first lands 422 of the chip module 400 may be provided on a bottom surface of the inner substrate 410. The inner substrate 410 of the chip module 400 may contact the first redistribution substrate 100, and may be connected to the first redistribution substrate 100 through the first substrate via 130 which penetrates the uppermost first substrate dielectric layer 110 and is coupled to the first land 422. Accordingly, the chip module 400 may be electrically connected to the connection substrate 200 and the external terminals 140.

A molding layer 500 may be provided on the connection substrate 200. The molding layer 500 may cover the connection substrate 200, the semiconductor chip 300, and the chip module 400. The molding layer 500 may fill the first and second openings OP1 and OP2 of the connection substrate 200. For example, in the first opening OP1 of the connection substrate 200, the molding layer 500 may fill a gap between the connection substrate 200 and the semiconductor chip 300. In the second opening OP2 of the connection substrate 200, the molding layer 500 may fill a gap between the connection substrate 200 and the chip module 400 In addition, the molding layer 500 may fill a space between the semiconductor chip 300 and the first redistribution substrate 100, a space between the chip module 400 and the first redistribution substrate 100, or a space between the connection substrate 200 and the first redistribution substrate 100. The molding layer 500 may cover the top surface of the connection substrate 200 and expose the upper pads 222. In some embodiments, the molding layer 500 may not cover the top surface of the connection substrate 200.

In some example embodiments of the present inventive concepts, as the chip module 400 does not have a separate molding member, the molding layer 500 may be in direct contact with the first passive device 430 and the inner substrate 410 of the chip module 400. As the chip module 400 does not have a separate molding member, the chip module 400 may decrease in size. Moreover, because the first passive device 430 of the chip module 400 is buried in and protected by the molding layer 500 of a semiconductor package, the first passive device 430 may not be exposed to external impact, and neither the chip module 400 nor the semiconductor package may deteriorate in structural stability.

A second redistribution substrate 600 may be provided on the molding layer 500. The second redistribution substrate 600 may include one or more substrate wiring layers that are stacked on each other. The substrate wiring layers may each include a second substrate dielectric layer 610 and a second substrate wiring pattern 620 in the second substrate dielectric layer 610. The second substrate wiring pattern 620 of one substrate wiring layer may be electrically connected to the second substrate wiring pattern 620 of another substrate wiring layer.

The second substrate dielectric layer 610 may include or may be formed of a dielectric polymer or a photo-imagable dielectric (PID) polymer. For example, the photo-imagable dielectric polymer may include one or more of photosensitive polyimide, polybenzoxazole (PBO), phenolic polymers, and benzocyclobutene polymers.

The second substrate wiring pattern 620 may be provided in the second substrate dielectric layer 610. The second substrate wiring pattern 620 may horizontally extend in the second substrate dielectric layer 610. For example, the second substrate wiring pattern 620 may be a pad or a signal line part of the substrate wiring layer. The second substrate wiring pattern 620 may be a component for horizontal redistribution in the second redistribution substrate 600. The second substrate wiring pattern 620 may be provided in a lower portion of the second substrate dielectric layer 610. A bottom surface of the second substrate wiring pattern 620 may be exposed on a bottom surface of the second substrate dielectric layer 610. The second substrate wiring pattern 620 may include or may be formed of a conductive material. For example, the second substrate wiring pattern 620 may include or may be formed of copper (Cu). The second substrate wiring pattern 620 of an uppermost substrate wiring layer may be disposed on a top surface of an upper portion of the second substrate dielectric layer 610 and may be exposed at the top surface of the upper portion of the second substrate dielectric layer 610, and may serve as a pad on which an external package or an electronic device is mounted.

A second substrate via 630 may be provided below the second substrate wiring pattern 620. The second substrate via 630 may be a component for vertical connection between the second substrate wiring patterns 620 of neighboring substrate wiring layers. The second substrate via 630 may be a component for connection between the second substrate wiring pattern 620 of a lowermost substrate wiring layer and the upper pad 222 of the connection substrate 200. For example, the second substrate via 630 may be provided on the bottom surface at a portion of the second substrate wiring pattern 620. The second substrate via 630 may penetrate from the bottom surface of the second substrate wiring pattern 620 to the second substrate dielectric layer 610 of an underlying substrate wiring layer, and may be coupled to a top surface of the second substrate wiring pattern 620. The second substrate via 630 may penetrate to the molding layer 500 from the bottom surface of the second substrate wiring pattern 620, and may be coupled to a top surface of the upper pad 222.

As such, it may be possible to provide a semiconductor package discussed with reference to FIG. 1.

According to some example embodiments, compared to the semiconductor package of FIG. 1 or the chip module 400 of FIG. 5, the chip module 400 of the semiconductor package may further include a second passive device 460.

Figure 6:
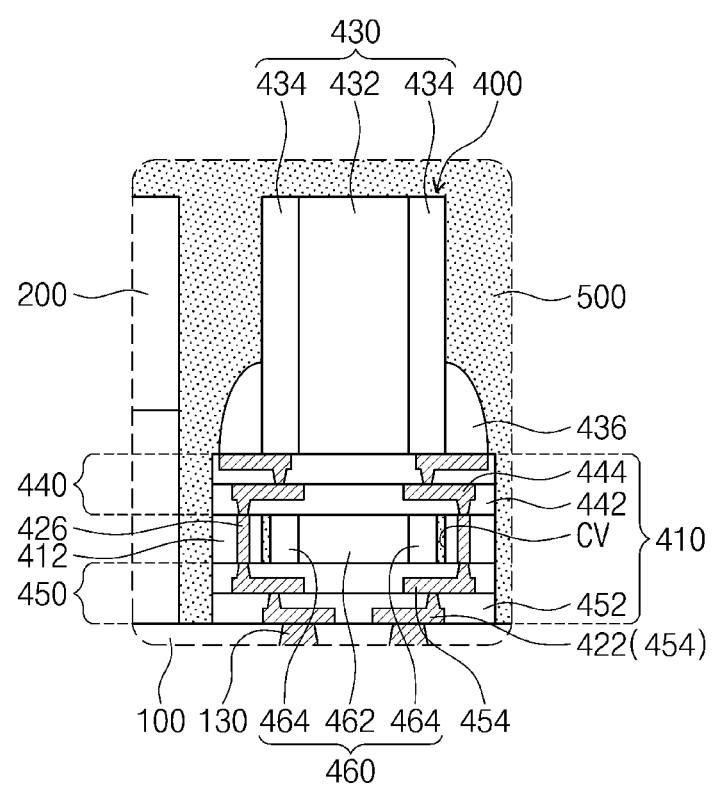

Referring to FIG. 6, the inner substrate 410 of the chip module 400 may include an upper build-up part 440 and a lower build-up part 450.

The upper build-up part 440 may cover the top surface of the core part 412. The upper build-up part 440 may include a plurality of upper dielectric layers 442 and a plurality of upper wiring lines 444 that are alternately stacked on the top surface of the core part 412.

The lower build-up part 450 may cover the bottom surface of the core part 412. The lower build-up part 450 may include a plurality of lower dielectric layers 452 and a plurality of lower wiring lines 454 that are alternately stacked on the bottom surface of the core part 412.

The core part 412 may have a cavity CV therein. The cavity CV may be an area where a portion of the core part 412 is removed from the inner substrate 410. For example, as shown in FIG. 6, the cavity CV may vertically penetrate the core part 412 to extend from the top surface of the core part 412 to the bottom surface thereof. For example, the cavity CV may be defined to indicate an area from which a portion of the core part 412 is removed and which is surrounded by the core part 412, the upper build-up part 440, and the lower build-up part 450. When viewed in a plan view, the cavity CV may be positioned at a central portion of the inner substrate 410. For example, the cavity CV may be located between the vertical connection terminals 426.

In some embodiments, the cavity CV may not vertically penetrate the core part 412. For example, the cavity CV may be an area that is recessed and inwardly directed from the top or bottom surface of the core part 412. For example, the cavity CV may be defined to indicate an area from which a portion of the core part 412 is removed and which is surrounded either by the core part 412 and the upper build-up part 440 or by the core part 412 and the lower build-up part 450.

In some embodiments, a cavity may be an area formed by removing a portion of one selected from the upper build-up part 440 and the lower build-up part 450. For example, the cavity may be defined to indicate an area from which either a portion of the upper build-up part 440 is removed and which is surrounded by the core part 412 and the upper build-up part 440 or a portion of the lower build-up part 450 is removed and which is surrounded by the core part 412 and the lower build-up part 450.

In some embodiments, a cavity may be defined to indicate an area from which is removed a portion of the core part 412 and a portion of one selected from the upper and lower build-up parts 440 and 450 and which is surrounded by the core part 412, the upper build-up part 440, and the lower build-up part 450.

The second passive device 460 may be provided in the cavity CV. The second passive device 460 may include a capacitor, a resistor, or an inductor. For convenience, the following will describe an example in which a capacitor is adopted as the second passive device 460, but a resistor, an inductor, or any suitable device may be selected as the second passive device 460.

The second passive device 460 may be a multi-layer ceramic capacitor (MLCC) in which electrodes 464 are provided on opposite lateral surfaces of a ceramic main body 462 The opposite electrodes 464 of the second passive device 460 may be connected to the upper wiring lines 444 of the upper build-up part 440 or the lower wiring lines 454 of the lower build-up part 450. For example, the opposite electrodes 464 may be connected to the upper wiring lines 444 of the upper build-up part 440 using upper vias 445. The first passive device 430 (e.g., a first capacitor) and the second passive device 460 (e.g., a second capacitor) may be connected in parallel with each other to increase capacitance. In some embodiments, the opposite electrodes 464 may be connected to the lower wirings lines 454 of the lower build-up part 450 using lower vias connecting the opposite electrodes 464 and the lower wiring lines 454 with each other. In some embodiments, the opposite electrodes 464 may be connected both to the upper build-up part 440 and the lower build-up part 450 using the upper vias 445 and the lower vias, respectively. For the simplicity of drawings, the lower vias are omitted, but may be connected to the opposite electrodes 464 similarly to the upper vias 445.

According to some example embodiments of the present inventive concepts, the first passive device 430 may be mounted on the inner substrate 410 of the chip module 400, and the second passive device 460 may be provided in the cavity CV of the inner substrate 410. Therefore, no space may be separately required to additionally provide the second passive device 460, and the chip module 400 may decrease in size and increase in integration. Furthermore, as the second passive device 460 is provided in the inner substrate 410, a short electrical length may be provided for wiring the second passive device 460. In conclusion, it may be provided a semiconductor package having compact size, high integration, and improved electrical characteristics.

Figure 7:
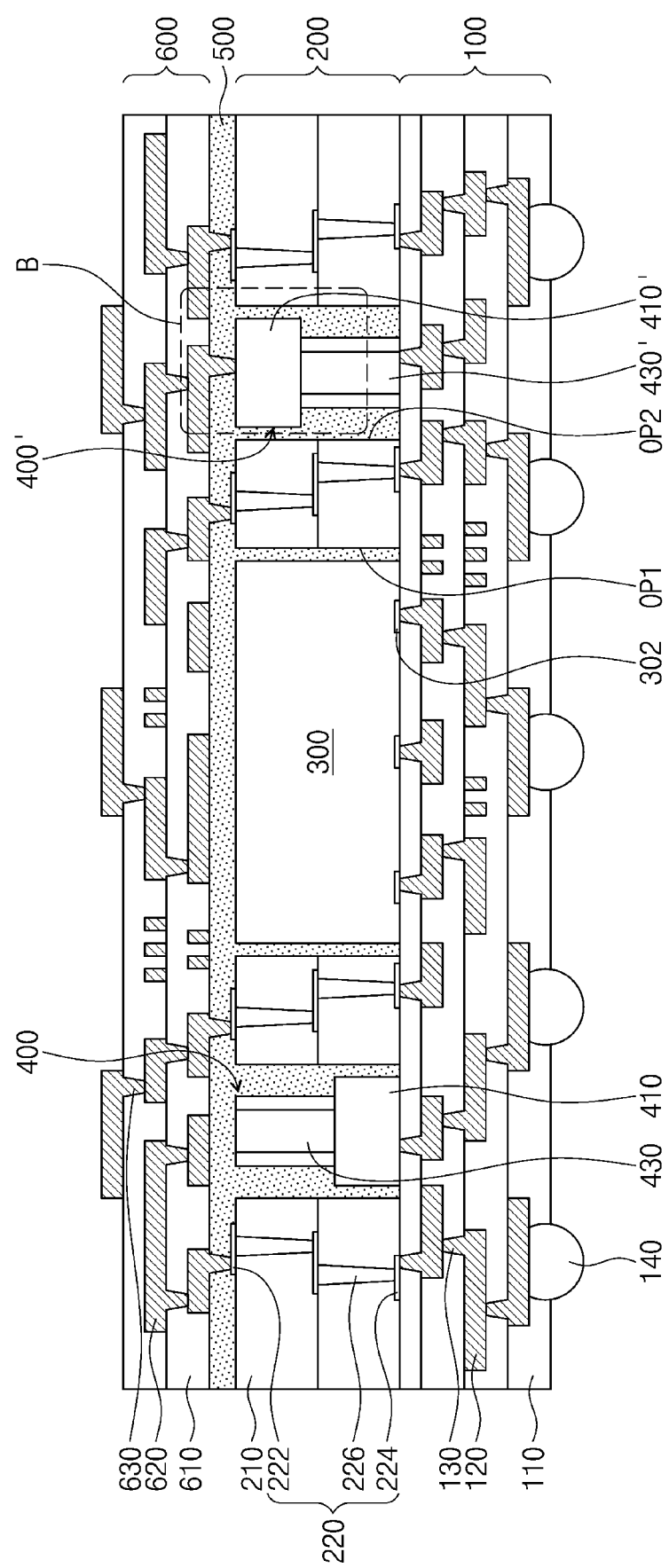
FIG. 7 illustrates a cross-sectional view showing a semiconductor package according to some example embodiments of the present inventive concepts.
Figure 8:
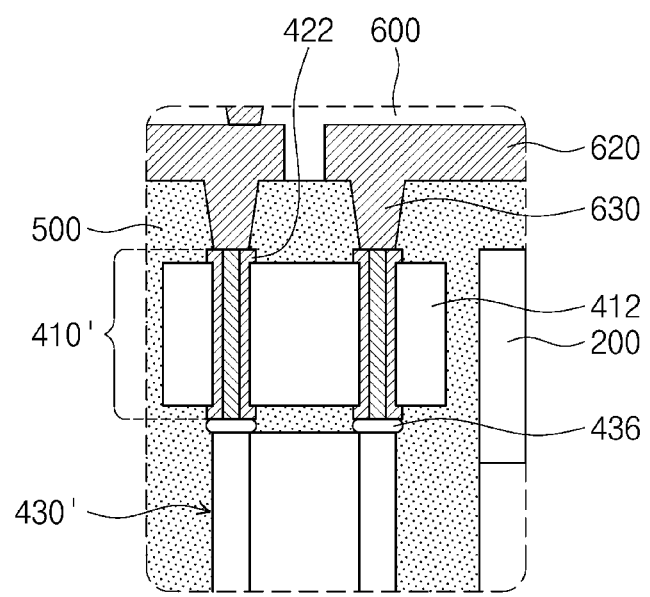
FIG. 8 illustrates an enlarged cross-sectional view showing a chip module of a semiconductor package according to some example embodiments of the present inventive concepts.

FIG. 7 illustrates a cross-sectional view showing a semiconductor package according to some example embodiments of the present inventive concepts. FIG. 8 illustrates an enlarged cross-sectional view of section B depicted in FIG. 7, showing a chip module of a semiconductor package according to some example embodiments of the present inventive concepts.

FIGS. 1 to 6 illustrate that at least one chip module 400 is mounted on the first redistribution substrate 100, but the present inventive concepts are not limited thereto.

Referring to FIGS. 7 and 8, at least one chip module 400' may be mounted on the second redistribution substrate 600.

For example, the chip module 400' may include an inner substrate 410' directed toward the second redistribution substrate 600, and may also include a first passive device 430' directed toward the first redistribution substrate 100. For example, the first passive device 430' may be located on the first redistribution substrate 100, and the inner substrate 410' may be disposed on the first passive device 430'. The chip module 400' may be mounted on the second redistribution substrate 600 in an upside-down configuration of the chip module 400 mounted on the first redistribution substrate 100.

The second substrate via 630 of the second redistribution substrate 600 may penetrate to the molding layer 500 from the bottom surface of the second substrate wiring pattern 620 toward the inner substrate 410', and may be coupled to the top surface of the first land 422 of the inner substrate 410'.

According to some example embodiments of the present inventive concepts, the first passive device 430 may be modularized into the chip module 400. The chip module 400 may be provided in various arrangements or shapes, if needed. For example, the chip module 400 may be provided in a face-down state on the first redistribution substrate 100, and/or the chip module 400' may be provided in a face-up state on the first redistribution substrate 100. In some embodiments, the chip modules 400 and 400' may be mounted on one of the first and second redistribution substrates 100 and 600, respectively, and a semiconductor package may increase in the degree of freedom of wiring.

Figure 9:
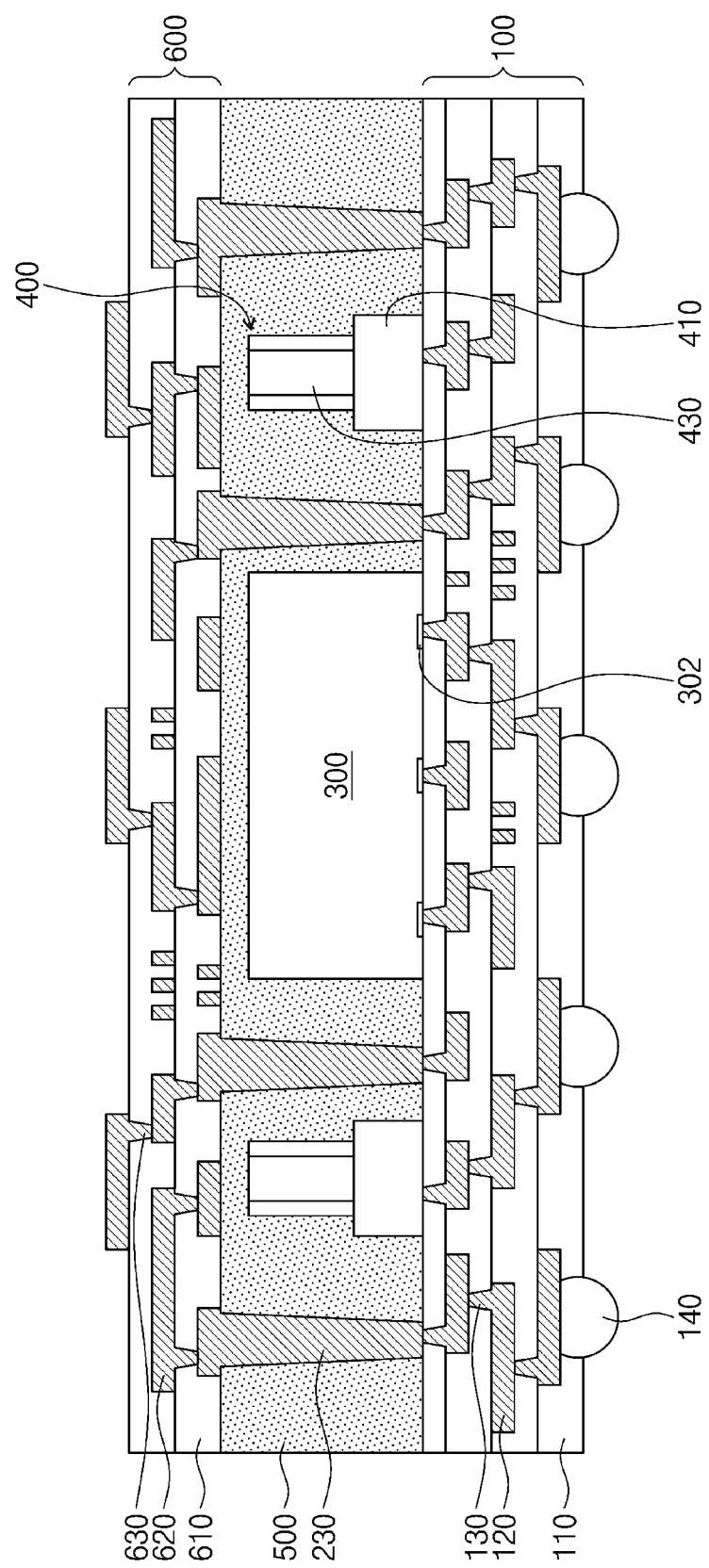
FIGS. 9 to 11 illustrate cross-sectional views showing a semiconductor package according to some example embodiments of the present inventive concepts.
Figure 10:
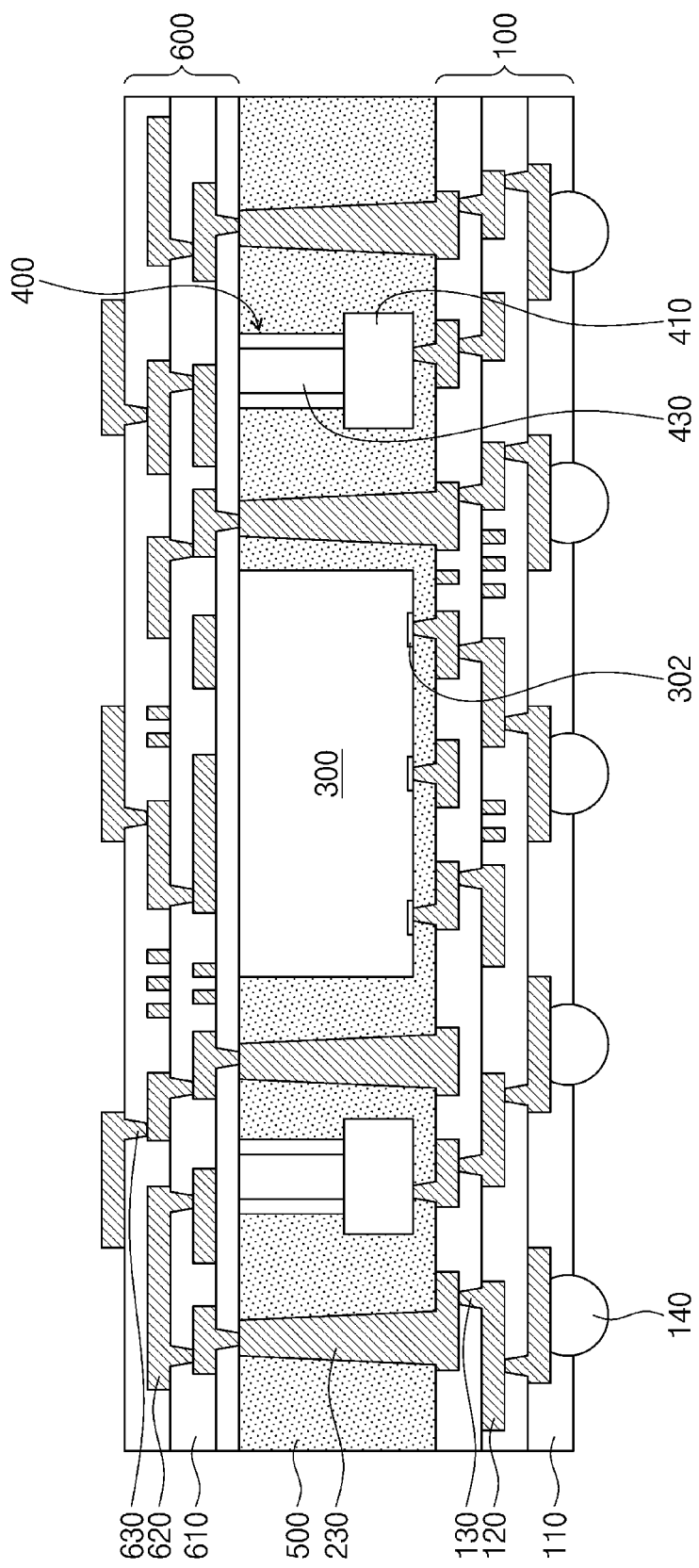

FIGS. 9 and 10 illustrate cross-sectional views showing a semiconductor package according to some example embodiments of the present inventive concepts.

Compared to the semiconductor packages of FIGS. 1 to 8, a semiconductor package may not include the connection substrate 200.

Referring to FIG. 9, the molding layer 500 may fill a space between the first redistribution substrate 100 and the second redistribution substrate 600. On the first redistribution substrate 100, the molding layer 500 may bury the semiconductor chip 300 and the at least one chip module 400. For example, the molding layer 500 may surround the semiconductor chip 300 and the at least one chip module 400, and may cover the top surface of the semiconductor chip 300 and the top surface of the at least one chip module 400. In this case, the semiconductor chip 300 and the at least one chip module 400 may be in contact with the first redistribution substrate 100 and may be directly bonded to the first redistribution substrate 100. The chip module 400 may have various, example configurations as described with reference to FIGS. 2 to 6.

The semiconductor package may further include a through electrode 230. The through electrode 340 may be located laterally spaced apart from the semiconductor chip 300 and the at least one chip module 400. The through electrode 230 may be located between the semiconductor chip 300 and an outer lateral surface of the molding layer 500, between the at least one chip module 400 and another outer lateral surface of the molding layer 500, or between the semiconductor chip 300 and the at least one chip module 400. The through electrode 230 may vertically penetrate the molding layer 500. The through electrode 230 may be coupled to an uppermost first substrate via 130 of the first redistribution substrate 100. The through electrode 230 may be electrically connected through the first redistribution substrate 100 to the external terminal 140, the semiconductor chip 300, and the at least one chip module 400. The through electrode 230 may be coupled to the second substrate wiring pattern 620 of the second redistribution substrate 600. The through electrode 230 may include a metal pillar. The through electrode 230 may have a width that increases in a direction from the first redistribution substrate 100 toward the second redistribution substrate 600.

In FIG. 9, the through electrode 230 may be integrally provided with a lowermost second substrate wiring pattern 620 of the second redistribution substrate 600. For example, the through electrode 230 may be formed concurrently when the lowermost second substrate wiring pattern 620 is formed. In some embodiments, the through electrode 230 may be provided as a component that is provided separately from the lowermost second substrate wiring pattern 620.

Referring to FIG. 10, the molding layer 500 may fill a space between the first redistribution substrate 100 and the second redistribution substrate 600. On the first redistribution substrate 100, the molding layer 500 may bury the semiconductor chip 300 and the at least one chip module 400. For example, the molding layer 500 may surround the semiconductor chip 300 and the at least one chip module 400, and may cover the bottom surface of the semiconductor chip 300 and the bottom surface of the at least one chip module 400. In this case, the semiconductor chip 300 and the at least one chip module 400 may be in contact with the second redistribution substrate 600.

The semiconductor package may further include a through electrode 230. The through electrode 340 may be located laterally spaced apart from the semiconductor chip 300 and the at least one chip module 400. The through electrode 230 may vertically penetrate the molding layer 500. The through electrode 230 may be coupled to the uppermost first substrate wiring pattern 120 of the first redistribution substrate 100 and the lowermost second substrate via 630 of the second redistribution substrate 600.

For the first redistribution substrate 100, the first substrate wiring pattern 120 may be provided in the first substrate dielectric layer 110. The first substrate wiring pattern 120 may be provided in an upper portion of the first substrate dielectric layer 110. The top surface of the first substrate wiring pattern 120 may be exposed at the top surface of the first substrate dielectric layer 110.

The first substrate via 130 may be provided on the first substrate wiring pattern 120. The first substrate via 130 may be a component for vertical connection between the first substrate wiring patterns 120 of neighboring substrate wiring layers. The first substrate via 130 may be a component for connection between the first substrate wiring pattern 120 of the uppermost substrate wiring layer and the chip pad 302 of the semiconductor chip 300. For example, the first substrate via 130 may penetrate to the molding layer 500 from the top surface of the first substrate wiring pattern 120, and may be coupled to a bottom surface of the chip pad 302.

The through electrode 230 may include a metal pillar. The through electrode 230 may have a width that increases in a direction from the second redistribution substrate 600 toward the first redistribution substrate 100.

In FIG. 10, the through electrode 230 may be integrally provided with the uppermost first substrate wiring pattern 120 of the first redistribution substrate 100. For example, the through electrode 230 may be formed concurrently when the uppermost first substrate wiring pattern 120 is formed. In some embodiments, the through electrode 230 may be provided as a component that is provided separately from the uppermost first substrate wiring pattern 120.

Figure 11:
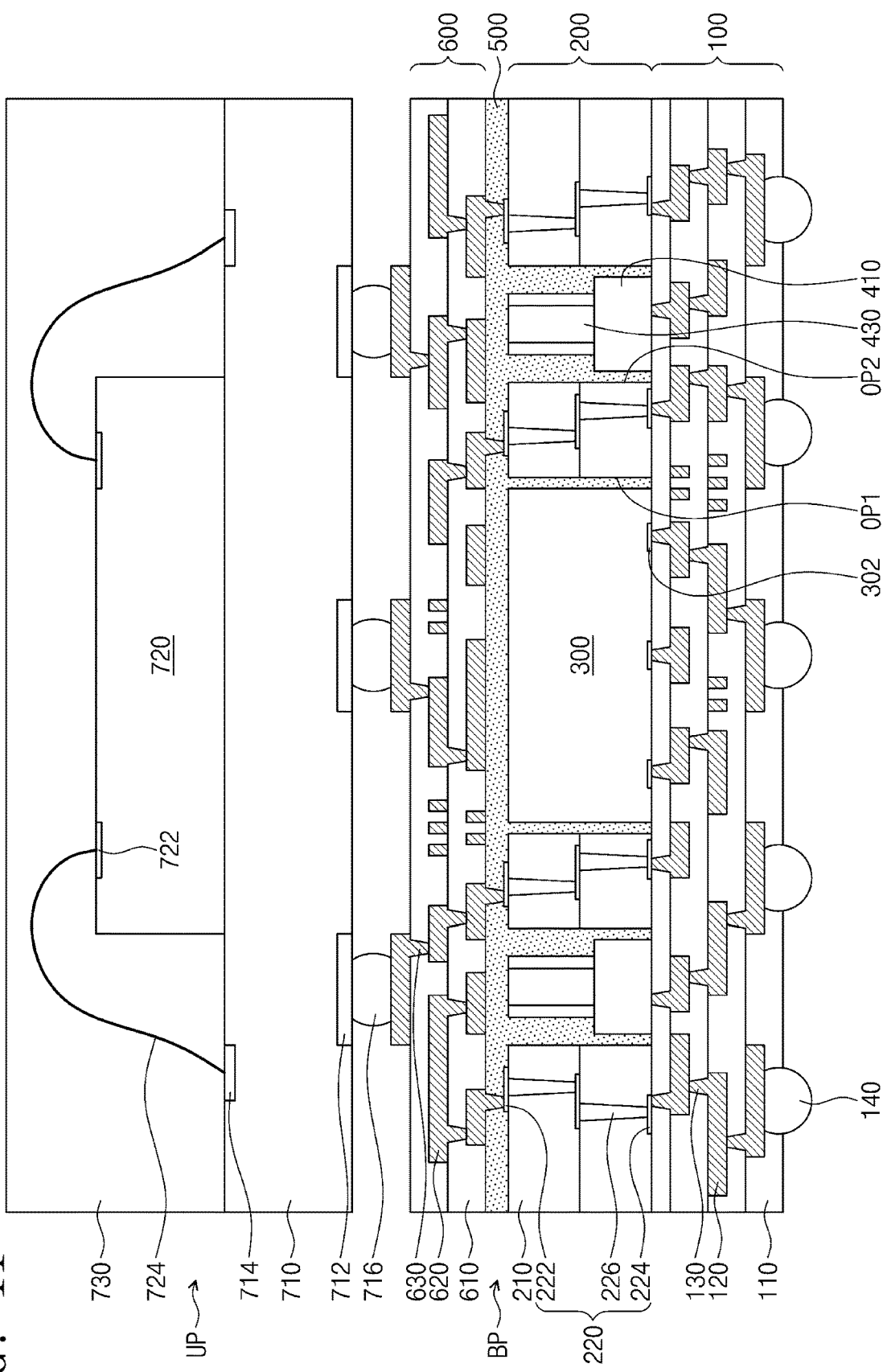

FIG. 11 illustrates a cross-sectional view showing a semiconductor package according to some example embodiments of the present inventive concepts.

Referring to FIG. 11, a semiconductor package may include a lower package BP and an upper package UP. For example, the semiconductor package may be a package-on-package (POP) in which the upper package UP is mounted on the lower package BP.

The lower package BP may be the same as or similar to one of the semiconductor packages as discussed with reference to FIGS. 1 to 10. For example, the lower package BP may include a first redistribution substrate 100, a connection substrate 200 mounted on the first redistribution substrate 100, a semiconductor chip 300 and a chip module 400 that are provided on the first redistribution substrate 100 and are respectively located in a first opening OP1 and a second opening OP2 of the connection substrate 200, a molding layer 500 that is provided on the first redistribution substrate 100 and cover the connection substrate 200, the semiconductor chip 300, and the chip module 400, and a second redistribution substrate 600 on the molding layer 500. In some embodiments, the lower package BP may include a first redistribution substrate 100, a semiconductor chip 300 and a chip module 400 that are mounted on the first redistribution substrate 100, a molding layer 500 that is provided on the first redistribution substrate 100 and cover the semiconductor chip 300 and the chip module 400, a second redistribution substrate 600 on the molding layer 500, and a through electrode (see 230 of FIG. 9 or 10) that is provided on a side of each of the semiconductor chip 300 and the chip module 400 and connects the first redistribution substrate 100 to the second redistribution substrate 600.

The upper package UP may be mounted on the lower package BP. The upper package UP may include an upper package substrate 710, an upper semiconductor chip 720, and an upper molding layer 730.

The upper package substrate 710 may be a printed circuit board (PCB). In some embodiments, the upper package substrate 710 may be a redistribution substrate. The upper package substrate 710 may have first upper substrate pads 712 located on a bottom surface thereof. The upper package substrate 710 may have second upper substrate pads 714 located on a top surface thereof.

The upper semiconductor chip 720 may be located on the upper package substrate 710. The upper semiconductor chip 720 may include integrated circuits, and the integrated circuits may include a memory circuit, a logic circuit, or a combination thereof. The upper semiconductor chip 720 may be of a different type from the semiconductor chip 300. The upper semiconductor chip 720 may have upper chip pads 722 that are electrically connected through boding wires 724 to the second upper substrate pads 714 of the upper package substrate 710. FIG. 11 depicts that the upper semiconductor chip 720 is mounted in a wire bonding method, but the upper semiconductor chip 720 may be mounted in various ways.

The upper package substrate 710 may be provided thereon with the upper molding layer 730 that covers the upper semiconductor chip 720. The upper molding layer 730 may include or may be formed of a dielectric polymer, such as an epoxy-based polymer.

One or more conductive terminals 716 may be disposed between the lower package BP and the upper package UP. The conductive terminals 716 may be interposed between the uppermost second substrate wiring patterns 620 of the second redistribution substrate 600 and the first upper substrate pads 712 of the upper package substrate 710, and may be electrically connected to the second substrate wiring patterns 620 and the first upper substrate pads 712. Therefore, the upper package UP may be electrically connected to the semiconductor chip 300 and the external terminals 140 through the conductive terminals 716, the second redistribution substrate 600, and the first redistribution substrate 100.

FIGS. 12 to 21 illustrate cross-sectional views showing a method of fabricating a semiconductor package according to some example embodiments of the present inventive concepts. FIGS. 12 to 15 correspond to cross-sectional views showing a method of fabricating a chip module of a semiconductor package according to some example embodiments of the present inventive concepts.

Figure 12:
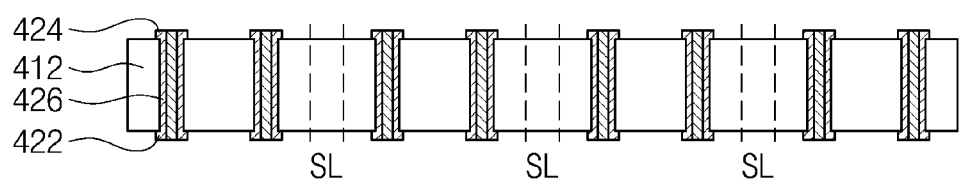
FIGS. 12 to 21 illustrate cross-sectional views showing a method of fabricating a semiconductor package according to some example embodiments of the present inventive concepts.

Referring to FIG. 12, a core part 412 may be provided. The core part 412 may be portions that constitute the inner substrate 410 of the chip module 400 as discussed with reference to FIGS. 1 to 11. The core part 412 may include or may be formed of a dielectric material.

Vertical connection terminals 426 may be formed in the core part 412. For example, the vertical connection terminals 426 may be formed by forming holes that penetrate the core part 412, and then filling the holes with a conductive material. At this stage, the conductive material may be coated to cover a bottom or top surface of the core part 412, and on the bottom or top surface of the core part 412, the conductive material may be patterned to form first lands 422 or second lands 424.

The vertical connection terminals 426 may be spaced apart from each other across separation lines SL. In this description, the separation lines SL may be defined to indicate zones where a sawing process is performed to separate chip modules (see 400 of FIG. 13) from each other.

Figure 13:
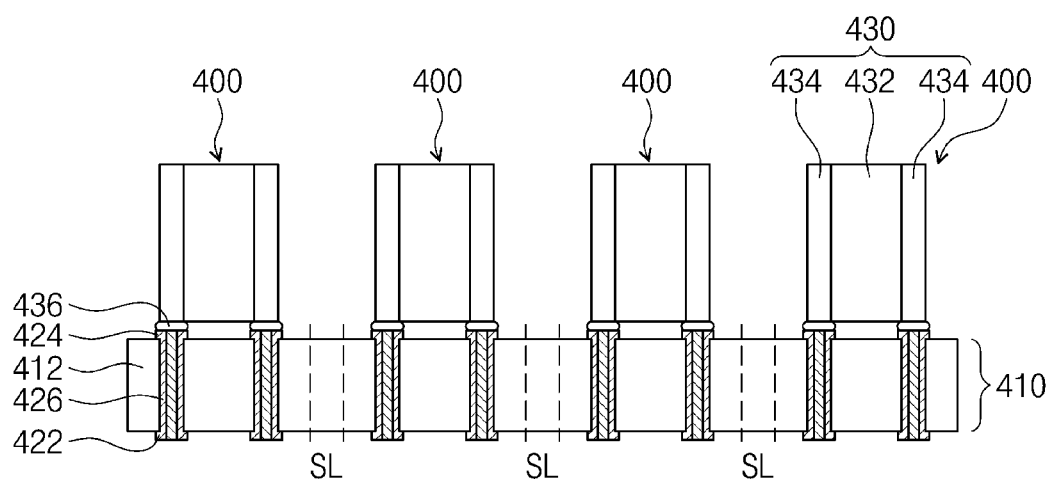

Referring to FIG. 13, first passive devices 430 may be mounted on the core part 412. A surface mount technology (SMT) may be used to mount the first passive devices 430 on the second lands 424 of the core part 412. For example, solder pastes may be provided onto the core part 412 on which the second lands 424 are provided. The solder pastes may be provided on the second lands 424 or on the second lands 424 and the core part 412. The first passive device 430 may be placed on the solder pastes. A length between the second lands 424 may be the same as or greater than a width of the first passive device 430. A reflow process may be performed in a state where the first passive device 430 is placed on the solder pastes. In the reflow process, the solder pastes may be melted and the first passive device 430 may descend to lie on the core part 412. The solder paste may be reflowed to form an inner connection terminal 436, and the inner connection terminal 436 may fill a space between the second lands 424 and an electrode 434 of the first passive device 430 to thereby electrically connect the first passive device 430 to the second lands 424 or the core part 412. The mounting of the first passive device 430, however, is not limited to that mentioned above.

Figure 14:
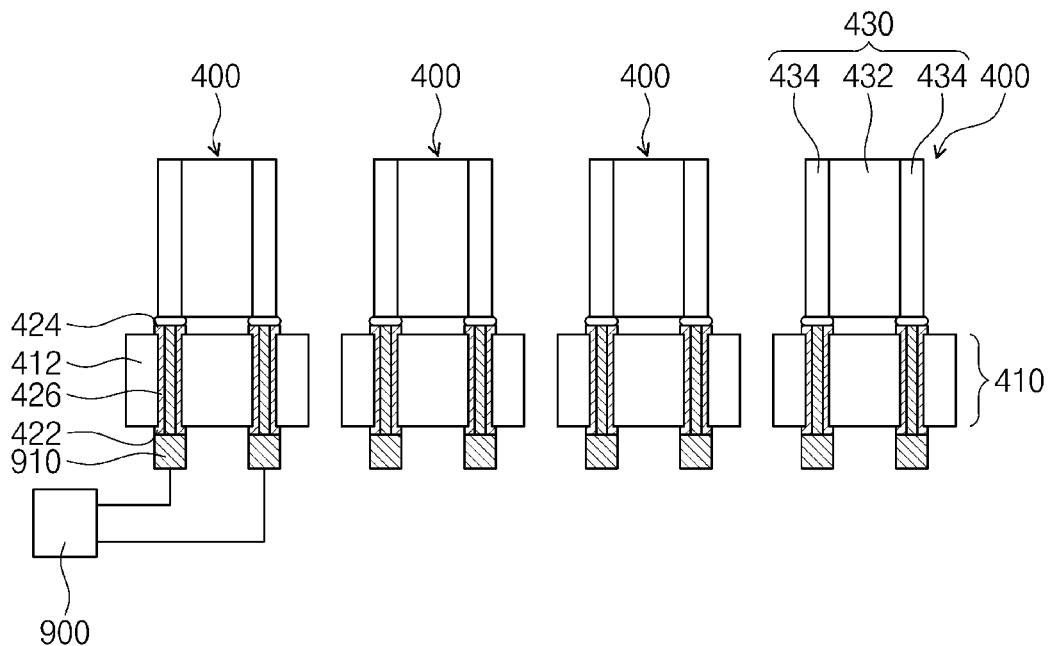
Figure 15:
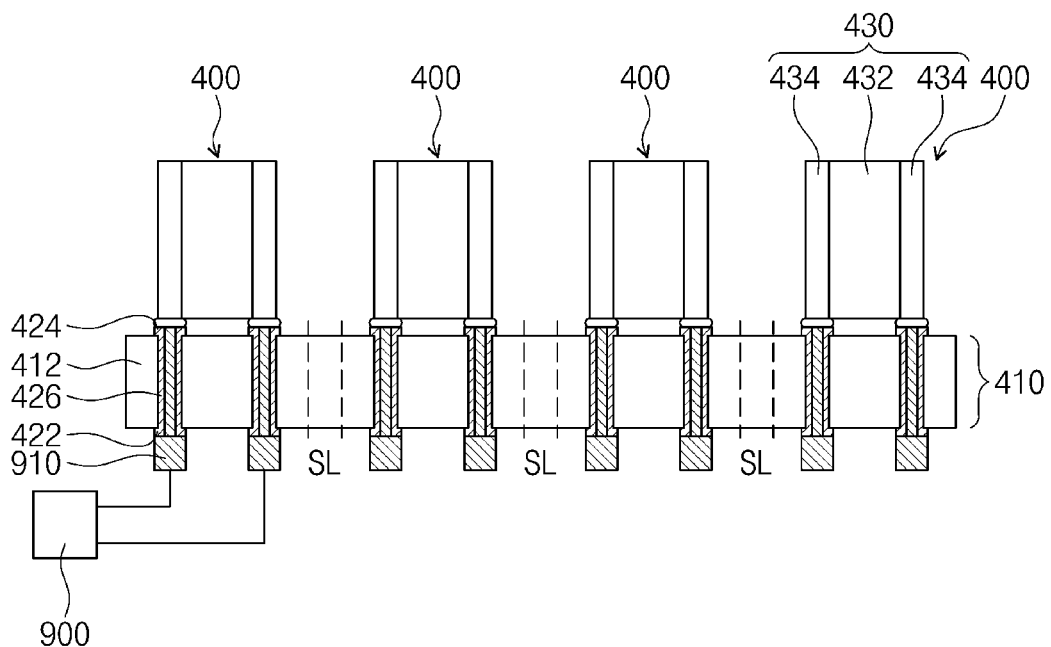

Referring to FIG. 14, the core part 412 may undergo a singulation process, such as sawing, to form inner substrates 410. The sawing process may be performed along the separation lines (see SL of FIG. 13). Therefore, the inner substrates 410 may be separated from each other, and a plurality of chip modules 400 may be formed.

Afterwards, an inspection apparatus 900 may be used to inspect defects of the chip modules 400. According to some example embodiments of the present inventive concepts, the first passive device 430 may be mounted on the inner substrate 410 to constitute the chip module 400, and may be electrically connected to the outside through the first lands 422 of the inner substrate 410. Therefore, coupling terminals 910 (e.g., probes, tips, or any suitable members) of the inspection apparatus 900 may be easily coupled to the first lands 422, and may inspect whether the first passive device 430 is defective or not using the first lands 422. In addition, defects of the chip module 400 may be inspected before a semiconductor package is fabricated, and thus it may be possible to prevent the fabrication of defective semiconductor packages.

Differently from that discussed above, as shown in FIG. 15, defects of the first passive devices 430 may be inspected before performing the singulation process on the core part 412. Thereafter, the singulation process may be selectively performed on the first passive devices 430 that are determined normal (i.e., determined as being passed in the inspection).

As such, the chip module 400 may be manufactured.

Figure 16:
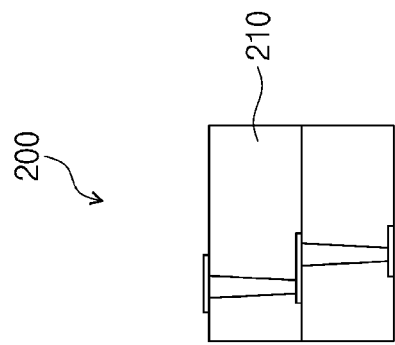
Figure 16:
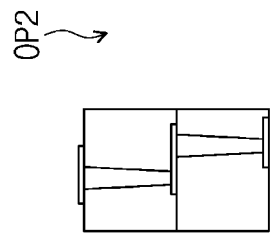
Figure 16:
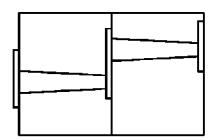
Figure 16:
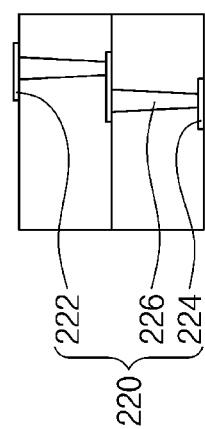

Referring to FIG. 16, a connection substrate 200 may be provided. The connection substrate 200 may include a base layer 210 and a conductive member 220 in the base layer 210. For example, a printed circuit board (PCB) may be used as the connection substrate 200. The conductive member 220 may include upper pads 222, lower pads 224, and vias 226. In some embodiments, the conductive member 220 may further include a landing pad to connect two adjacent vias with each other.

A first opening OP1 and at least one second opening OP2 may be formed in the connection substrate 200. The formation of the first opening OP1 and the at least one second opening OP2 may include partially removing the connection substrate 200 to form holes that vertically penetrate the connection substrate 200. For example, the formation of the first opening OP1 and the at least one second opening OP2 may be carried out by an etching process or a physical process such as drilling, laser ablation, or laser cutting. The first opening OP1 formed by removing a portion of the connection substrate 200 may be a space where a semiconductor chip (see 300 of FIG. 17) is to be provided in a subsequent process, and the at least one second opening OP2 formed by removing another portion of the connection substrate 200 may be a space where a chip module (see 400 of FIG. 17) is to be provided in a subsequent process. The first opening OP1 and the at least one second opening OP2 may each be shaped like an open hole that connects top and bottom surfaces of the connection substrate 200. For example, such open holes of the first opening OP1 and the at least one second opening OP2 may extend from a top surface of the base layer 210 to a bottom surface of the base layer 210.

Figure 17:
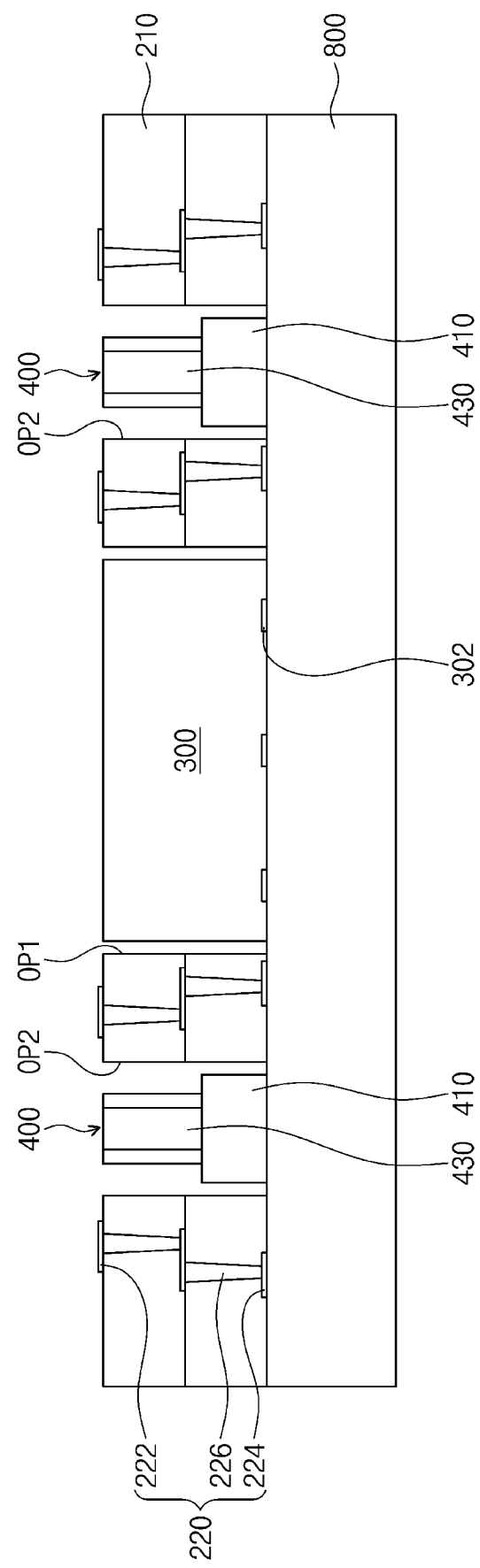

Referring to FIG. 17, the connection substrate 200 may be provided on a first carrier substrate 800. The connection substrate 200 may be adhered onto the first carrier substrate 800. For example, the first carrier substrate 800 may include an adhesive tape. In some embodiments, an adhesive member (not shown) may further be provided between the first carrier substrate 800 and the connection substrate 200.

A semiconductor chip 300 and at least one chip module 400 may be provided on the first carrier substrate 800. The semiconductor chip 300 with chip pads 302 may be provided in the first opening OP1 of the connection substrate 200. At this stage, the chip pads 302 of the semiconductor chip 300 may be located to face the first carrier substrate 800. The semiconductor chip 300 may have an active surface at which an integrated circuits are formed, and the chip pads 302 are disposed on the active surface. The active surface may be attached to the first carrier substrate 800. The at least one chip module 400 may be provided in the at least one second opening OP2 of the connection substrate 200. At this stage, the inner substrate 410 of the chip module 400 may be located to face the first carrier substrate 800. The inner substrate 410 may be adhered onto the first carrier substrate 800. According to some example embodiments, the placement of the semiconductor chip 300 and the at least one chip module 400 may be followed by the placement of the connection substrate 200 on the first carrier substrate 800. In this case, the connection substrate 200 may be placed on the first carrier substrate 800 such that the semiconductor chip 300 and the at least one chip module 400 are allowed to lie on the first carrier substrate 800, and that the first opening OP1 and the at least one second opening OP2 may be aligned with the semiconductor chip 300 and the at least one chip module 400, respectively.

Figure 18:
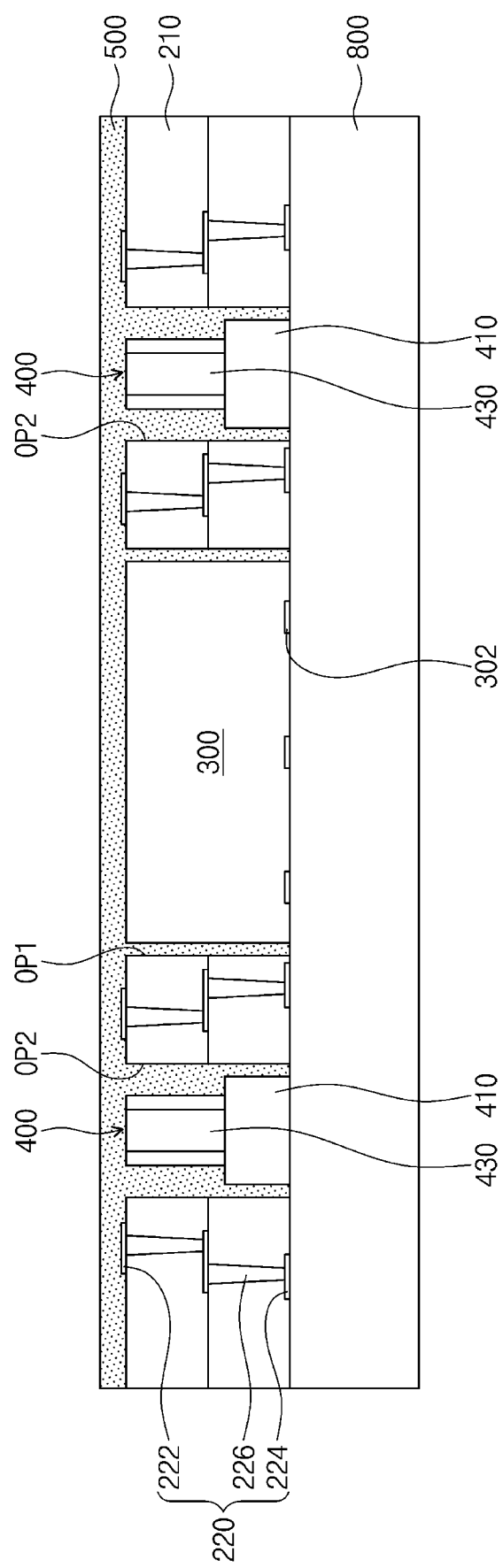

Referring to FIG. 18, a molding layer 500 may be formed on the first carrier substrate 800. For example, a molding member (not shown) may be coated on the connection substrate 200, the semiconductor chip 300, and at least one chip module 400, and then the molding member may be cured to form the molding layer 500. The molding layer 500 may cover a top surface of the connection substrate 200, a top surface of the semiconductor chip 300, and a top surface of the at least one chip module 400. At this stage, the molding member may be introduced between the connection substrate 200 and the semiconductor chip 300 and between the connection substrate 200 and the at least one chip module 400, and the molding layer 500 may fill a space between the connection substrate 200 and the semiconductor chip 300 and a space between the connection substrate 200 and the at least one chip module 400. The molding member may include or may be formed of an ajinomoto build-up film (ABF). In some embodiments, the molding member may include or may be formed of a dielectric polymer such as an epoxy-based polymer or a polymer material such as a thermosetting resin.

Figure 19:
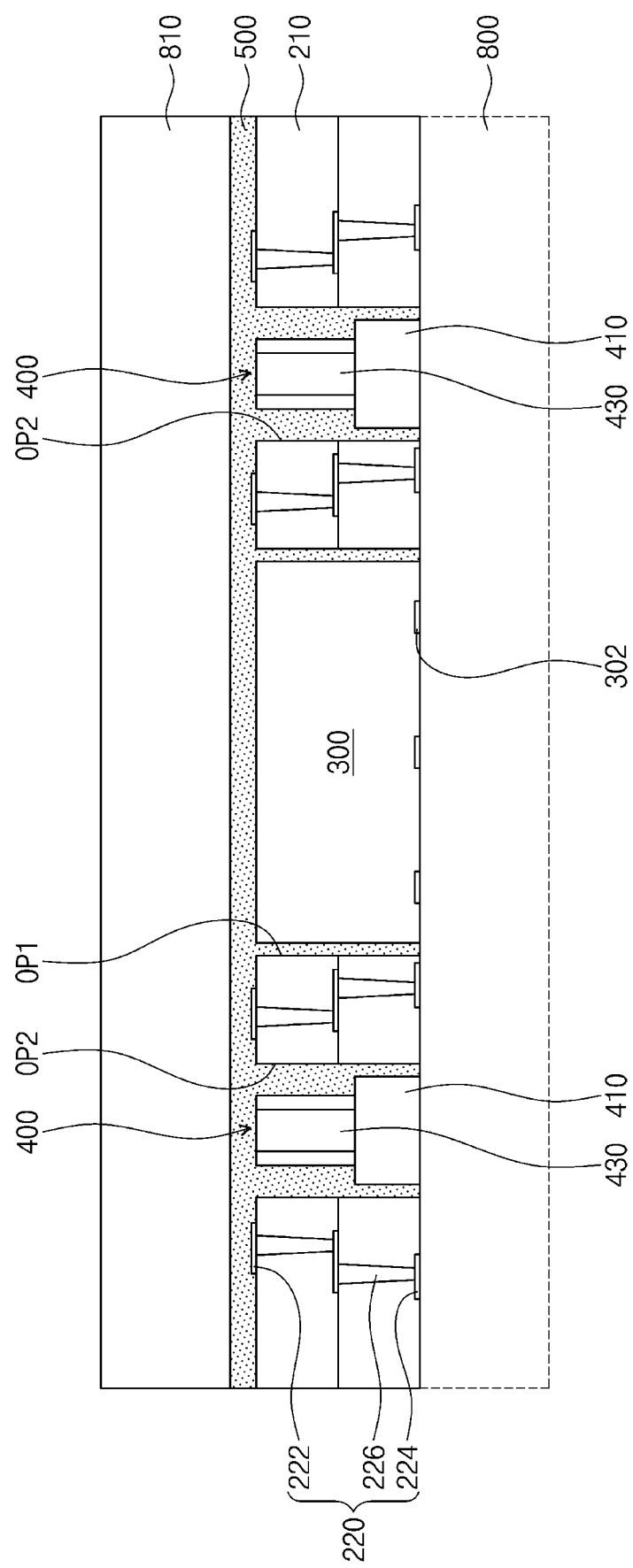

Referring to FIG. 19, a second carrier substrate 810 may be provided on the molding layer 500. The second carrier substrate 810 may be adhered onto the molding layer 500. For example, the second carrier substrate 810 may include an adhesive tape. In some embodiments, an adhesive member (not shown) may be provided between the second carrier substrate 810 and the molding layer 500.

After that, as illustrated by a dotted line in FIG. 19, the first carrier substrate 800 may be removed to expose a bottom surface of the connection substrate 200, a bottom surface of the semiconductor chip 300, and a bottom surface of the at least one chip module 400. When an adhesive member (not shown) is present on the first carrier substrate 800, the adhesive member may also be removed together with the first carrier substrate 800.

Figure 20:
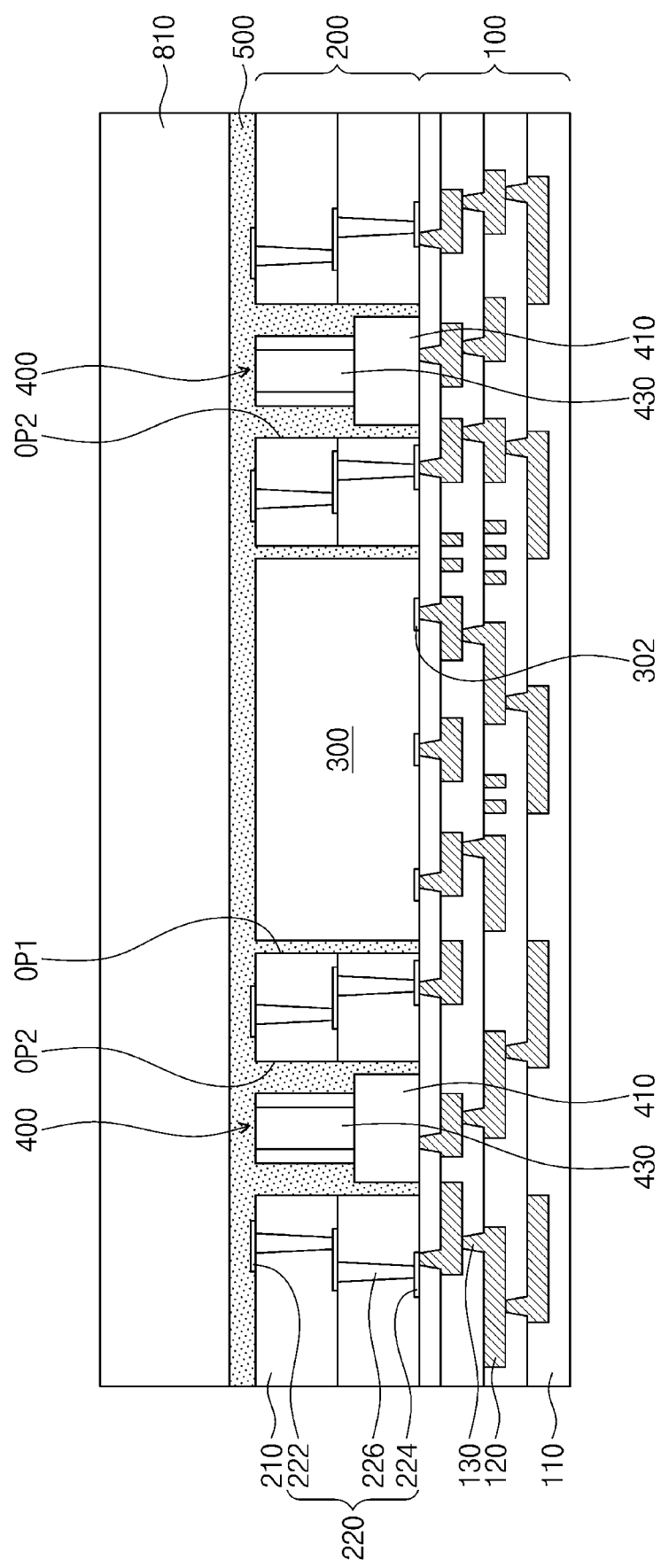

Referring to FIG. 20, a first redistribution substrate 100 may be formed below the connection substrate 200, the semiconductor chip 300, and the at least one chip module 400. For example, first substrate dielectric layers 110 and first substrate wiring patterns 120 may be formed on the bottom surface of the connection substrate 200, the bottom surface of the semiconductor chip 300, and the bottom surface of the at least one chip module 400 to form the first redistribution substrate 100. The first redistribution substrate 100 may include first substrate vias 130 that penetrate the first substrate dielectric layers 110 and connect the first substrate wiring patterns 120 with each other. The first substrate wiring pattern 120 may be coupled to the lower pads 224 of the connection substrate 200, the chip pads 302 of the semiconductor chip 300, and the first lands 422, as shown in FIGS. 2 to 6, of the inner substrate 410 of the at least one chip module 400.

Figure 21:
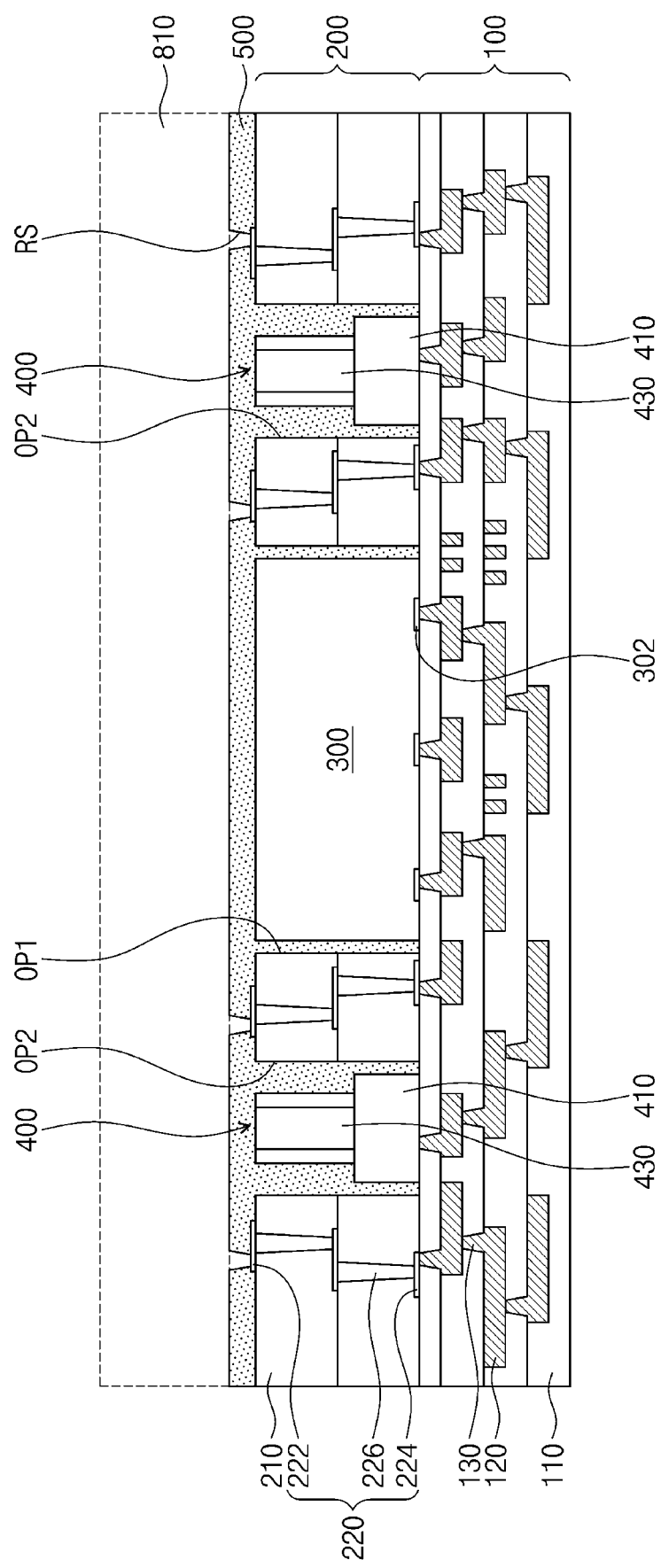

Referring to FIG. 21, the second carrier substrate 810 may be separated from the molding layer 500. The second carrier substrate 810 may be removed to expose a top surface of the molding layer 500 or a top surface of each of the molding layer 500 and a top surface of the connection substrate 200. When an adhesive member (not shown) is present on the second carrier substrate 810, the adhesive member may also be removed together with the second carrier substrate 810.

After the removal of the second carrier substrate 810, recesses RS may be formed at the molding layer 500. The recesses RS may penetrate the molding layer 500 and expose the upper pads 222 of the connection substrate 200. In some embodiments, the recesses RS may not be formed at the molding layer 500.

Referring back to FIG. 1, a second redistribution substrate 600 may be formed on the molding layer 500. For example, second substrate dielectric layers 610 and second substrate wiring patterns 620 may be formed on the top surface of the molding layer 500 or the top surface of each of the molding layer 500 and the top surface of the connection substrate 200 to form the second redistribution substrate 600. The second redistribution substrate 600 may include second substrate vias 630 that penetrate the second substrate dielectric layers 610 and connect the second substrate wiring patterns 620 with each other. The second substrate wiring patterns 620 may be coupled to the upper pads 222 of the connection substrate 200.

External terminals 140 may be formed on a bottom surface of the first redistribution substrate 100 and may be connected to the first substrate wiring patterns 120. The external terminals 140 may be electrically connected through the first redistribution substrate 100 to the connection substrate 200, the semiconductor chip 300, and the at least one chip module 400.

As such, it may be possible to fabricate a semiconductor package as discussed with reference to FIG. 1.

A semiconductor package according to some example embodiments of the present inventive concepts may include a chip module whose size and occupied area are small. Therefore, it may be possible to provide a compact-sized semiconductor package. In addition, the chip module may have a configuration where a passive device is mounted within an inner substrate, and the configuration of the chip module may allow the semiconductor package to have an increased degree of freedom of wiring.

Moreover, the chip module may have its electrical connection structure whose height is reduced, and thus the semiconductor package may decrease in height and size. A contact area between solders and electrodes of a capacitor may be increased to achieve an excellent electrical connection between the capacitor and the inner substrate. Accordingly, the semiconductor package may have improved electrical characteristics.

Furthermore, the passive device may not be exposed to external impact, and neither the chip module nor the semiconductor package may decrease in structural stability.

According to some example embodiments of the present inventive concepts, no space may be separately required to provide an additional passive device, and the chip module may have a small size, a high integration, and a short electrical length for wiring. In conclusion, the semiconductor package may become small in size, highly integrated, and improved in electrical characteristics.

According to some example embodiments of the present inventive concepts, coupling terminals of an inspection apparatus may be coupled to lands of the inner substrate, and may inspect whether the passive device is defective or not using the lands of the inner substrate. In addition, defects of the chip module may be inspected before the semiconductor package is fabricated, and thus it may be possible to prevent the fabrication of defective semiconductor packages.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising
a first redistribution substrate;
a connection substrate on the first redistribution substrate, the connection substrate including a first opening and a second opening that penetrate the connection substrate;
a semiconductor chip disposed on the first redistribution substrate and disposed in the first opening of the connection substrate;
a chip module disposed on the first redistribution substrate and disposed in the second opening of the connection substrate; and
a molding layer that covers the semiconductor chip, the chip module, and the connection substrate,
wherein the chip module includes:
an inner substrate; and
a first passive device on the inner substrate, and
wherein, in the second opening, the molding layer covers the first passive device on the inner substrate,
wherein the inner substrate includes a core part and a pair of first lands,
wherein the pair of first lands are disposed on a bottom surface of the core part and are spaced apart from each other on the bottom surface of the core part, and
wherein the first passive device is disposed on a region, between the pair of first lands, of the core part and is connected to the pair of first lands.

2. The semiconductor package of claim 1,
wherein the first passive device is electrically connected to the inner substrate through at least a pair of inner connection terminals, and
wherein each of the pair of inner connection terminals is interposed between a corresponding one of the pair of first lands and a corresponding one of opposite edges of the first passive device.

3. The semiconductor package of claim 2,
wherein each of the pair of inner connection terminals contacts an upper surface of the corresponding one of the pair of first lands and the corresponding one of the opposite edges of the first passive device.

4. The semiconductor package of claim 2,
wherein the first passive device includes a capacitor,
wherein the capacitor includes a ceramic body and a pair of electrodes, the pair of electrodes being on opposite lateral surfaces of the ceramic body, respectively, and
wherein each of the pair of inner connection terminals connects a corresponding one of the pair of electrodes to a corresponding one of the pair of first lands.

5. The semiconductor package of claim 2,
wherein the inner substrate further includes a pair of second lands disposed at a top surface of the core part and spaced apart from each other, and
wherein the pair of first lands are vertically aligned with the pair of second lands, respectively.

6. The semiconductor package of claim 2,
wherein the inner substrate includes:
a core part that includes a top surface and a bottom surface;
a pair of vertical connection terminals penetrating the core part; and
a lower build-up part on the bottom surface, the lower build-up part having a plurality of wiring lines connected to the pair of vertical connection terminals.

7. The semiconductor package of claim 2,
wherein the inner substrate includes:
a core part that includes a top surface and a bottom surface; and
a lower protective pattern that covers the bottom surface of the core part, and
wherein the pair of first lands penetrate the lower protective pattern to be connected to the bottom surface of the core part.

8. The semiconductor package of claim 6,
wherein the first passive device includes a capacitor on disposed in the second opening of the core part, the capacitor being mounted on the pair of first lands and in contact with the top surface of the core part.

9. The semiconductor package of claim 1,
wherein the inner substrate further includes:
a pair of vertical connection terminals; and
an upper build-up part and a lower build-up part on a top surface of the core part and a bottom surface of the core part, respectively, and electrically connected with each other via the pair of vertical connection terminals,
wherein the lower build-up part includes the pair of first lands,
wherein the pair of first lands are disposed on the bottom surface of the core part and are spaced apart from each other on the bottom surface of the core part, and
wherein the first passive device is disposed on a region, between the pair of first lands, of the core part.

10. The semiconductor package of claim 9,
wherein the inner substrate further includes:
a cavity formed at the core part; and
a second passive device disposed in the cavity, the second passive device being electrically connected to at least one of the upper build-up part and the lower build-up part.

11. The semiconductor package of claim 1,
wherein the inner substrate further includes:
a plurality of first lands at a bottom surface of the core part;
a plurality of second lands at a top surface of the core part; and
a plurality of vertical connection terminals that vertically penetrate the core part, each of the plurality of vertical connection terminals connecting a corresponding one of the plurality of first lands to a corresponding one of the plurality of second lands,
wherein the plurality of first lands are vertically aligned with the plurality of second lands, respectively,
wherein the plurality of first lands include the pair of first lands that are disposed on the bottom surface of the core part and are spaced apart from each other on the bottom surface of the core part, and
wherein the first passive device is disposed on a region, between the pair of first lands, of the core part.

12. A semiconductor package, comprising:
a first redistribution substrate;
a semiconductor chip mounted on the first redistribution substrate;
a chip module on the first redistribution substrate, the chip module being horizontally spaced apart from the semiconductor chip;
a molding layer on the first redistribution substrate, the molding layer surrounding the semiconductor chip and the chip module;
a second redistribution substrate on the molding layer;
a conductive member disposed in the molding layer and connecting the first redistribution substrate to the second redistribution substrate, wherein the conductive member is disposed in a space between the semiconductor chip and the chip module; and
an external terminal on a bottom surface of the first redistribution substrate,
wherein the chip module includes:
an inner substrate; and
a first device mounted on the inner substrate.

13. The semiconductor package of claim 12,
wherein the inner substrate includes:
a core part;
an upper build-up part on a top surface of the core part; and
a lower build-up part on a bottom surface of the core part, and
wherein the chip module further includes:
a second device in a cavity formed at the core part, the second device being electrically connected to at least one of the upper build-up part and the lower build-up part.

14. The semiconductor package of claim 12,
wherein the inner substrate includes a plurality of first lands spaced apart from each other on the inner substrate,
wherein the first device is provided on a region of the inner substrate between two adjacent first lands of the plurality of first lands, and
wherein the first device is electrically connected to the inner substrate through a plurality of inner connection terminals, each of the plurality of inner connection terminals being disposed between a corresponding one of the plurality of first lands and a corresponding one of opposite edges of the first device.

15. The semiconductor package of claim 14,
wherein the inner substrate includes:
a core part that includes a top surface and a bottom surface; and
a lower protective pattern that covers the bottom surface of the core part, and
wherein the plurality of first lands penetrate the lower protective pattern to be connected to the bottom surface of the core part.

16. The semiconductor package of claim 12,
wherein the inner substrate includes:
a core part that includes a top surface and a bottom surface;
a pair of vertical connection terminals penetrating the core part; and
a lower build-up part on the bottom surface of the core part, the lower build-up part including a plurality of wiring lines connected to the pair of vertical connection terminals.

17. The semiconductor package of claim 16,
wherein the first device includes a capacitor on the core part, the capacitor contacting the top surface of the core part.

18. The semiconductor package of claim 12,
wherein the inner substrate includes:
a core part that includes a top surface and a bottom surface;
a pair of vertical connection terminals; and
an upper build-up part and a lower build-up part provided on the top surface of the core part and the bottom surface of the core part, respectively, and electrically connected with each other via the pair of vertical connection terminals.

19. A method of fabricating a semiconductor package, the method comprising:
forming a chip module;
forming in a connection substrate a first opening and a second opening that penetrate the connection substrate;
providing a carrier substrate below the connection substrate;
providing a semiconductor chip into the first opening and the chip module into the second opening;
forming a molding layer by coating a molding member on the semiconductor chip, the chip module, and the connection substrate;
removing the carrier substrate to expose a bottom surface of the semiconductor chip, a bottom surface of the chip module, and a bottom surface of the connection substrate; and
forming a redistribution substrate below the semiconductor chip, the chip module, and the connection substrate,
wherein forming the chip module includes:
providing an inner substrate having a first land at a bottom surface of the inner substrate, a second land at a top surface thereof, and an inner connection terminal connecting the first land to the second land;
mounting a passive device on the second land at the top surface of the inner substrate; and
inspecting an operation of the passive device by using the first land at the bottom surface of the inner substrate.

20. The method of claim 19,
wherein the forming of the chip module includes:
providing the inner substrate;
mounting a plurality of passive devices on the top surface of the inner substrate; and
performing a sawing process on the inner substrate to form a plurality of chip modules separated from each other, and
wherein the inspecting of the operation of the passive device includes:
inspecting the plurality of passive devices on the inner substrate before performing the sawing process.

* * * * *